US006990024B2

(12) United States Patent
Hidaka

(10) Patent No.: US 6,990,024 B2
(45) Date of Patent: Jan. 24, 2006

(54) THIN FILM MAGNETIC MEMORY DEVICE HAVING DATA READ CURRENT TUNING FUNCTION

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 312 days.

(21) Appl. No.: 10/663,674

(22) Filed: Sep. 17, 2003

(65) Prior Publication Data

US 2004/0062092 A1 Apr. 1, 2004

Related U.S. Application Data

(62) Division of application No. 10/135,459, filed on May 1, 2002, now Pat. No. 6,646,911.

(30) Foreign Application Priority Data

Oct. 26, 2001 (JP) ...................................... 2001-329338

(51) Int. Cl.
*G11C 16/04* (2006.01)
*G11C 11/15* (2006.01)

(52) U.S. Cl. ................... 365/189.01; 365/173; 365/171

(58) Field of Classification Search ............ 365/189.01, 365/173, 171, 158
See application file for complete search history.

(56) References Cited

U.S. PATENT DOCUMENTS

| | | | | | |
|---|---|---|---|---|---|
| 5,793,697 | A * | 8/1998 | Scheuerlein | ........... | 365/230.07 |
| 6,185,130 | B1 | 2/2001 | Hollmer et al. | | |
| 6,349,054 | B1 | 2/2002 | Hidaka | ....................... | 365/173 |
| 6,504,752 | B2 | 1/2003 | Ito | ............................. | 365/158 |
| 6,597,601 | B2 * | 7/2003 | Ooishi | ........................ | 365/171 |
| 6,614,681 | B2 | 9/2003 | Hidaka | ....................... | 365/171 |
| 6,856,539 | B2 | 2/2005 | Hidaka | | |
| 2003/0002333 | A1 | 1/2003 | Hidaka | | |

FOREIGN PATENT DOCUMENTS

| | | |
|---|---|---|
| DE | 101 30 829 | 7/2002 |
| DE | 102 28 578 | 1/2003 |
| EP | 1 225 591 | 7/2002 |

OTHER PUBLICATIONS

Scheuerlein, et al., "A 10ns Read and Write Non–Volatile Memory Array Using A Magnetic Tunnel Junction and FET Switch in Each Cell" ISSCC Digest of Technical Paper, TA 7.2, Feb. 8, 2000, pp. 94–95, 128–129 and 409–410.

Durlam, et al., "Nonvolatile RAM Based on Magnetic Tunnel Junction Elements" ISSCC Digest of Technical Papers, TA7.3. Feb. 8, 2000, pp. 96–97, 130–131 and 410–411.

Naji, et al., "A 256kb 3.0V ITIMTJ Nonvolatile Mangnetoresistive RAM" ISSCC Digest of Technical Papers, TA7.6. Feb. 6, 2001. pp. 94–95, 112–113, 404–405 and 438.

Scheuerlein, R.; Gallagher, W.; Parkin, S.; Lee, A.; Ray, S.; Robertazzi, R.; Reohr,W.; "A 10 ns read and write non–volatile memory array using a magnetic tunnel junction and FET switch in each cell" IEEE International Solid–State Circuits Conference, Feb. 7–9, 2000, 128–129.

(Continued)

*Primary Examiner*—Anh Phung
(74) *Attorney, Agent, or Firm*—McDermott Will & Emery LLP

(57) ABSTRACT

A constant current supply circuit generates a constant current according to a control voltage. A data read current passing through a tunneling magneto-resistance element constituting a memory cell during data write is set according to the constant current. Constant current supply circuit includes a voltage adjustment circuit generating a reference voltage adjustable according to an external input, a current source generating the constant current according to the reference voltage, and a voltage switch circuit transmitting the reference voltage to the current source as a control voltage during a normal operation.

25 Claims, 20 Drawing Sheets

OTHER PUBLICATIONS

Naji, P.K.; Durlam, M.; Tehrani, S.; Calder, J.; Deherrera, M.F., "A 256 kb 3.0 V 1T1MTJ nonvolatile magnetoresistive RAM" IEEE International Solid–State Circuits Conference, Feb. 5–7, 2001, 122–123, 438.

Yamada, K.; Sakai, N.; Ishizuka, Y.; Mameno, K.; "A novel sensing scheme for an MRAM with 5% MR ratio" Symposium on VLSI Circuits, Jun. 14–16, 2001 123–124.

Tehrani, S.; Engel, B.; Slaughter, J.M.; Chen, E.; DeHerrera, M.; Naji, P.; Burlam, M.; Whig, R.; Janesky, J.; Calder, J.; "Recent developments in magentic tunnel junction MRAM" IEEE Transactions on Magnetics, vol. 36, No. 5, Sep. 2000, 2752–2757.

Scheuerlein, R.E.; "Magnetoresistive IC memory limitations and architecture implications" 7th Biennial IEEE Nonvolatile Memory Technology Conference, Jun. 22–24, 1998, 47–50.

Freitas, P.P.; Cardoso, S.; Sousa, R.; Wanjun K; Ferreira, R.; Chu, V.; Conde, J.P.; "Spin dependent tunnel junctions for memory and read–head applications"IEEE Transactions on Magnetics, vol. 36, No. 5, Sep. 2000, 2796–2801.

* cited by examiner

THIN FILM MAGNETIC MEMORY DEVICE HAVING DATA READ CURRENT TUNING FUNCTION

This application is a divisional of application Ser. No. 10/135,459 filed May 1, 2002, now U.S. Pat. No. 6,646,911, issued on Nov. 11, 2003.

BACKGROUND OF THE INVENTION

1. Field of the Invention

The present invention relates to a thin film magnetic memory device, and more particularly relates to a random access memory provided with memory cells having magnetic tunnel junctions (MTJs).

2. Description of the Background Art

As a memory device capable of storing nonvolatile data with low consumption power, attention has been paid to an MRAM (Magnetic Random Access Memory) device. The MRAM device is a memory device which stores nonvolatile data using a plurality of thin film magnetic elements formed on a semiconductor integrated circuit and which can access each of the thin film magnetic elements.

Recently, it has been made public that the performance of the MRAM device surprisingly advances by using tunneling magneto-resistance element which are thin film magnetic bodies using magnetic tunnel junctions (MTJ's) as memory cells. The MRAM device provided with memory cells having MTJs is disclosed by technical documents such as "A 10 ns Read and Write Non-Volatile Memory Array Using a Magnetic Tunnel Junction and FET Switch in each Cell", ISSCC Digest of Technical Papers, TA7.2, February 2000., "Nonvolatile RAM based on Magnetic Tunnel Junction Elements", ISSCC Digest of Technical Papers, TA7.3, February 2000., and "A 256 Kb 3.0V 1T1MTJ Nonvolatile Magnetoresistive RAM", ISSCC Digest of Technical Papers, TA7.6, February 2001.

FIG. 22 is a schematic view showing configuration of a memory cell having a magnetic tunnel junction (hereinafter, also referred to simply as "MTJ memory cell").

Referring to FIG. 22, the MTJ memory cell is provided with a tunneling magneto-resistance element TMR in which electric resistance changes with respect to stored data level, and an access element ATR for forming a path of a sense current Is passing through tunneling magneto-resistance element TMR during data read. Since access element ATR is typically formed of a field effect transistor, access element ATR will be also referred to as "access transistor ATR" hereinafter. Access transistor ATR is connected in series to tunneling magneto-resistance element TMR.

A write word line WWL for indicating data write, a read word line RWL for executing data read, and a bit line BL which is a data line for transmitting an electrical signal corresponding to the data level of stored data during the data read and data write, are arranged for the MTJ memory cell.

FIG. 23 is a conceptual view for explaining a data read operation from the MTJ memory cell.

Referring to FIG. 23, tunneling magneto-resistance element TMR includes a ferromagnetic layer (hereinafter, also referred to as "fixed magnetic layer") FL having a fixed, constant magnetization direction, and a ferromagnetic layer (hereinafter, also referred to as "free magnetic layer") VL magnetized in a direction according to a magnetic field applied externally. A tunneling barrier (tunneling film) TB formed of an insulating film is provided between fixed magnetic layer FL and free magnetic layer VL. Free magnetic layer VL is magnetized in the same direction as or the opposite direction to that of fixed magnetic layer FL in accordance with the data level of stored data to be written. Fixed magnetic layer FL, tunnel barrier TB and free magnetic layer VL form a magnetic tunnel junction.

In the data read operations, access transistor ATR is turned on in response to the activation of read word line RWL and tunneling magneto-resistance element TMR is connected between bit line BL and a ground voltage Vss. As a result, a bias voltage in accordance with the voltage of the bit line is applied to the both ends of tunneling magneto-resistance element TMR and a tunnel current flows in tunneling film (tunneling barrier) TB. By using such a tunnel current, it is possible to carry a sense current to the current path formed of bit line BL, tunneling magneto-resistance element TMR, access transistor ATR, and ground voltage Vss.

The electric resistance of tunneling magneto-resistance element TMR changes according to the relative relationship between the magnetization direction of fixed magnetic layer FL and that of free magnetic layer VL. Specifically, if the magnetization direction of fixed magnetic layer FL is same (parallel) to that of free magnetic layer VL, the electric resistance value of tunneling magneto-resistance element TMR is a minimum value Rmin, and if these magnetization directions are opposite (non-parallel) to each other, the electric resistance value of tunneling magneto-resistance element TMR is a maximum value Rmax.

Accordingly, if free magnetic layer VL is magnetized in a direction according to the stored data, a voltage change which occurs to tunneling magneto-resistance element TMR due to sense current Is differs according to the level of the stored data. Therefore, if sense current Is is carried to tunneling magneto-resistance element TMR after precharging bit line BL with a constant voltage, for example, the stored data of the memory cell can be read by sensing the voltage of bit line BL.

FIG. 24 is a conceptual view for explaining a data write operation to the MTJ memory cell.

Referring to FIG. 24, during data write, read word line RWL is inactivated and access transistor ATR is turned off. In this state, a data write current for magnetizing free magnetic layer VL in a direction according to the write data, is carried to each of write word line WWL and bit line BL.

FIG. 25 is a conceptual view for explaining the relationship between the data write current and the magnetization direction of tunneling magneto-resistance element TMR during data write.

Referring to FIG. 25, the horizontal axis indicates a magnetic field applied in an easy axis (EA) direction in free magnetic layer VL in tunneling magneto-resistance element TMR. On the other hand, the vertical axis H (HA) indicates a magnetic field effecting in a hard axis (HA) direction in free magnetic layer VL. Magnetic fields H (EA) and H (HA) correspond to two magnetic fields generated by currents carried to bit line BL and write word line WWL, respectively.

In the MTJ memory cell, the fixed magnetization direction of fixed magnetic layer FL is along the easy axis of free magnetic layer VL, and free magnetic layer VL is magnetized in a direction parallel or non-parallel (opposite) to fixed magnetic layer FL along the easy axis direction in accordance with the level of stored data ("1" and "0"). The MTJ memory cell can store 1-bit data ("1" and "0") corresponding to the two magnetization directions of free magnetic layer VL, respectively.

The magnetization direction of free magnetic layer VL can be rewritten only if the sum of magnetic fields H (EA)

and H (HA) applied to free magnetic layer VL reaches a region outside of an asteroid characteristic line shown in FIG. 25. In other words, if the data write magnetic field applied to free magnetic layer VL has an intensity corresponding to the region inside of the asteroid characteristic line, the magnetization direction of free magnetic layer VL does not change.

As shown in the asteroid characteristic line, if a magnetic field in the hard axis direction is applied to free magnetic layer VL, it is possible to decrease a magnetization threshold value necessary to change the magnetization direction of free magnetic layer VL along the easy axis.

If operation points during data write are designed as shown in the example of FIG. 25, the data write magnetic field in the easy axis direction is designed so as to have an intensity of $H_{WR}$ in the MTJ memory cell to which the data is to be written. That is, the value of the data write current carried to either of bit line BL or write word line WWL is designed so as to obtain data write magnetic field $H_{WR}$. Generally, data write magnetic field $H_{WR}$ is expressed by the sum of a switching magnetic field $H_{SW}$ necessary to change over a magnetization direction and a margin ΔH, i.e., $H_{WR}=H_{SW}+\Delta H$.

To rewrite the stored data of the MTJ memory cell, i.e., to rewrite the magnetization direction of tunneling magneto-resistance element TMR, it is necessary to carry a data write current at predetermined level or more to each of write word line WWL and bit line BL. Thus, free magnetic layer VL in tunneling magneto-resistance element TMR is magnetized in the direction parallel or opposite (non-parallel) to that of fixed magnetic layer FL in accordance with the direction of the data write magnetic field along the easy axis (EA). The magnetization direction which is written to tunneling magneto-resistance element TMR once, i.e., the stored data of the MTJ memory cell held in a nonvolatile manner until new data is written.

As described above, the electric resistance of tunneling magneto-resistance element TMR changes according to the magnetization direction which can be rewritten by the data write magnetic field applied thereto, so that if electric resistance values Rmax and Rmin of tunneling magneto-resistance element TMR are made to correspond to the levels ("1" and "0") of the stored data, it is possible to store data in a nonvolatile manner.

Thus, sense current Is which passes through tunneling magneto-resistance element TMR during data write is carried as the tunnel current which passes through tunneling film (tunneling barrier) TB. However, the voltage-to-current characteristic, i.e., voltage applied to tunneling film (bias voltage) to tunnel current characteristic of tunneling magneto-resistance element TMR largely depend on the thickness of the tunneling film. Therefore, depending on the manufacturing irregularity of the tunneling film thickness in a manufacturing process, sense current Is during data write largely changes.

In other words, even if the same bias voltage is applied, sense current Is carried to tunneling magneto-resistance element TMR largely changes depending on the manufacturing irregularity of the tunneling film thickness, so that the electric resistance value of tunneling magneto-resistance element TMR, i.e., the level of stored data cannot be accurately sensed from the voltage of the bit line. It is, therefore, necessary to constitute the MTJ memory cell so as to be capable of securing a data read margin corresponding to such manufacturing irregularity.

In addition, the electric resistance characteristic of tunneling magneto-resistance element TMR largely depends on temperature and bias voltage, whereby it is also necessary to consider securing the data read margin to correspond to these variations.

On the other hand, the reliability of the tunneling film largely depends on tunnel current. In other words, if a thin tunneling film is manufactured due to manufacturing irregularity, there is a probability that an excessive tunnel current flows during an ordinary operation to disadvantageously deteriorate the operation reliability of the entire MRAM device.

Furthermore, while it is necessary to conduct a defect acceleration test to ensure the reliability of the tunneling film so as to evaluate the reliability of tunneling magneto-resistance element TMR, tunneling film screening cannot be effectively carried out in an acceleration test conducted applying a high electric field as executed for a conventional MOS (Metal Oxide Semiconductor) type LSI (Large Scale Integrated Circuit).

SUMMARY OF THE INVENTION

It is an object of the present invention to provide a configuration of a thin film magnetic memory device capable of securing a data read margin to correspond to the manufacturing irregularity of the thickness of a tunneling film which forms a magnetic tunnel junction.

It is another object of the present invention to provide a configuration of a thin film magnetic memory device capable of efficiently executing a defect acceleration test for clarifying the potential defect of a tunneling film which forms a magnetic tunnel junction.

A thin film magnetic memory device according to this invention includes a plurality of memory cells each executing data storage; and a plurality of data lines arranged according to predetermined segments of the plurality of memory cells, respectively. Each of the plurality of memory cells includes a magnetic storage portion magnetized in a direction according to a level of stored data, and having a different electric resistance according to a magnetization direction; and an access element electrically connected to the magnetic storage portion in series between corresponding one of the plurality of data lines and a first voltage, and turned on in at least one selected memory cell as a data read target memory cell. The thin film magnetic memory device further includes: a select gate electrically connecting the data line corresponding to the selected memory cell among the plurality of data lines to an internal node; and a data read circuit reading the stored data of the selected memory cell. The data read circuit includes: a constant current circuit electrically connected between a second voltage and the internal node, and supplying a constant current according to a control voltage adjustable in a nonvolatile manner according to an external input, to the internal node; and a voltage amplification circuit generating read data according to a voltages of the internal node.

The above-mentioned thin film magnetic memory device can adjust the quantity of the current passing through the magnetic storage portion (tunneling magneto-resistance element) during data read according to an external input. It is, therefore, possible to secure a sufficient data read margin even if the manufacturing irregularity of the magnetic storage portions exists.

A thin film magnetic memory device according to another aspect of this invention includes: a plurality of memory cells each executing data storage; and a plurality of data lines arranged according to predetermined segments of the plurality of memory cells, respectively. Each of the plurality of memory cells includes: a magnetic storage portion having one of first and second electric resistances according to a level of stored data; and an access element electrically connected to the magnetic storage portion in series between corresponding one of the plurality of data lines and a first voltage, and selectively turned on. The thin film magnetic memory device further includes: a current supply circuit supplying a current passing through the magnetic storage portion. The current supply circuit supplies a first constant current to at least one of the data lines in a normal operation mode, and supplies a second constant current higher than the first constant current, to at least one of the data lines in another operation mode.

The above-mentioned thin film magnetic memory device can set the quantity of the passing current of the magnetic storage portion in another operation mode corresponding to the burn-in test, to be larger than that in the normal operation mode. It is, therefore, possible to efficiently execute a defect acceleration test to improve the reliability of the MRAM device.

Furthermore, it is preferable that the thin film magnetic memory device further includes a dummy memory cell provided for M memory cells (M: an integer not less than 2) among the plurality of memory cells. Preferably, the dummy memory cell includes: a dummy magnetic storage portion having an intermediate electric resistance between the first and second electric resistances; and a dummy access element electrically connected to the dummy magnetic storage portion in series between one of the plurality of data lines and the first voltage, and selectively turned on. Preferably, a current stress applied to the dummy magnetic storage portion in the another operation mode is higher than a current stress applied to the magnetic storage portion in at least one test target memory cell among the plurality of memory cells.

The above-mentioned thin film magnetic memory device can apply a current stress according to the difference in access frequency between the dummy memory cell and the normal memory cell during the burn-in test.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter in detail with reference to the drawings.

(First Embodiment)

Figure 1:
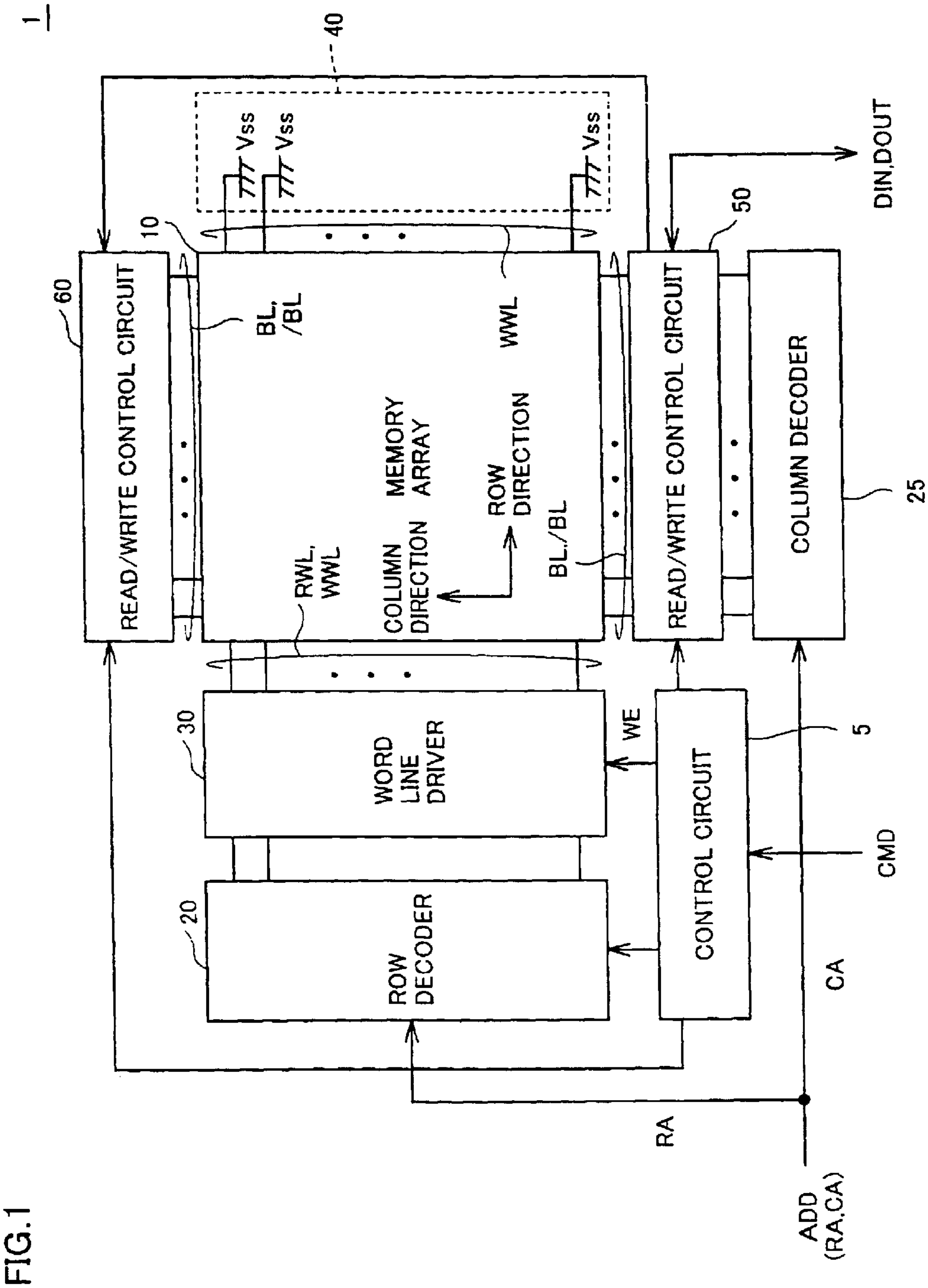
FIG. 1 is a schematic block diagram showing an entire configuration of an MRAM device 1 according to a first embodiment of the present invention.

Referring to FIG. 1, an MRAM device 1 according to embodiments of the present invention executes random access in response to a control signal CMD and an address signal ADD applied externally, and executes an input of a write data DIN and an output of a read data DOUT.

MRAM device 1 includes a control circuit 5 which controls the overall operation of MRAM device 1 in response to control signal CMD, and a memory array 10 which includes a plurality of memory cells arranged in a matrix. While the configuration of memory array 10 will be described later in detail, a plurality of write word lines WWL and a plurality of read word lines RWL are arranged to correspond to the rows of MTJ memory cells (hereinafter, also referred to simply as "memory cell rows"), respectively. In addition, a plurality of bit lines BL and /BL are arranged to correspond to the columns of MTJ memory cells (hereinafter, also referred to simply as "memory cell columns"), respectively.

MRAM device 1 further includes a row decoder 20, a column decoder 25, a word line driver 30 and read/write control circuits 50 and 60.

Row decoder 20 selects a row in memory cell array 10 in accordance with a row address RA represented by address signal ADD. Column decoder 25 selects a column in memory array 10 in accordance with a column address represented by address signal ADD. Word line driver 30 selectively activates read word line RWL or write word line WWL based on the row selection result of row decoder 20. Row address RA and column address CA indicate a memory cell designated as a data read target memory cell or a data write target memory cell (hereinafter, also referred to simply as "selected memory cell").

Each write word line WWL is connected to a ground voltage Vss in a region 40 on the opposite side, across memory array 10, to that on which word line driver 30 is arranged. Read/write control circuits 50 and 60 are the general term of circuit groups arranged in adjacent regions to memory array 10 to carry a data write current and a sense current (data read current) to bit lines BL and /BL of a selected memory cell column (hereinafter, also referred to simply as "selected column") corresponding to the selected memory cell during data read and data write, respectively.

Figure 2:
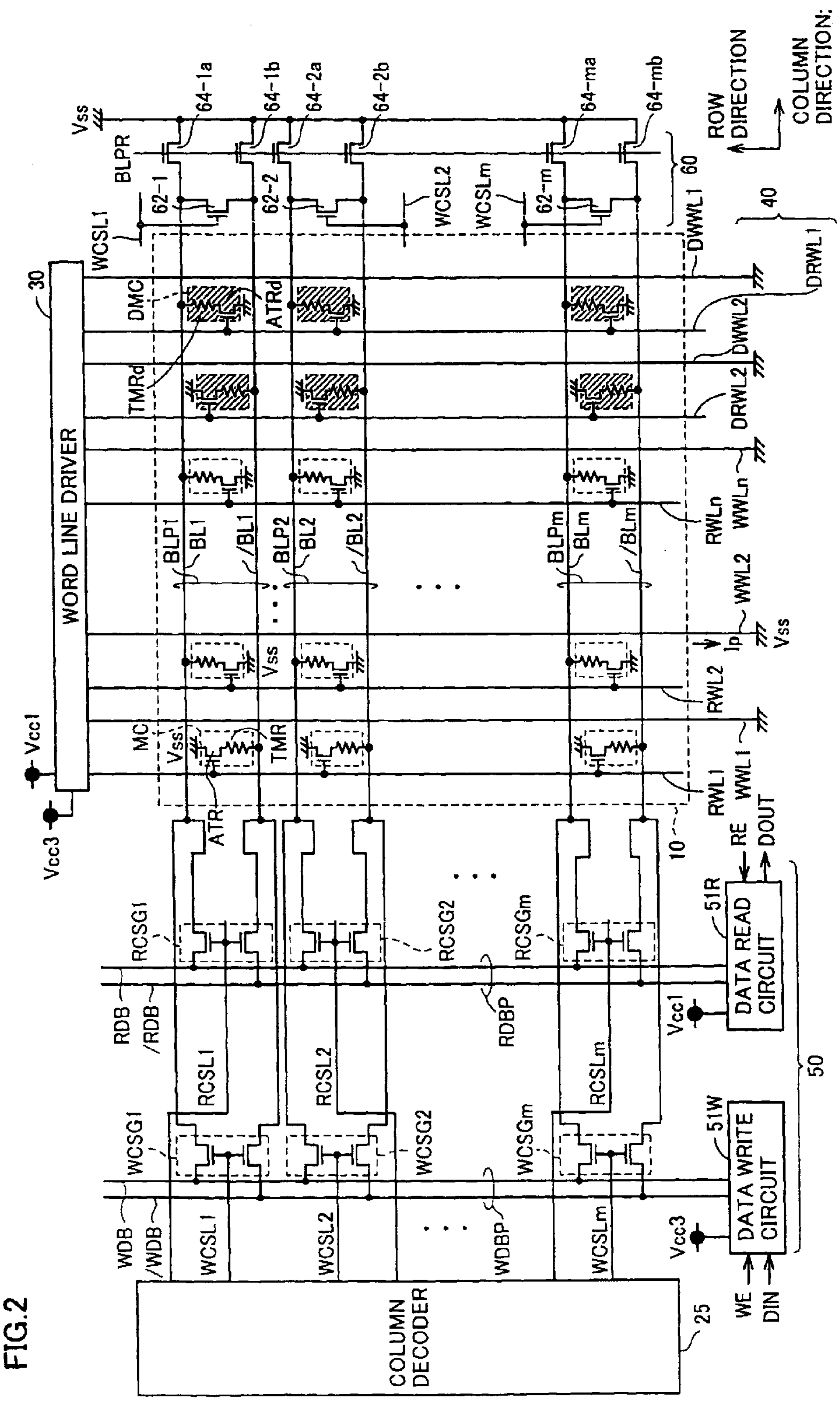
FIG. 2 is a circuit diagram showing a configuration of a memory array and peripheral circuits thereof shown in FIG. 1.
Figure 22:
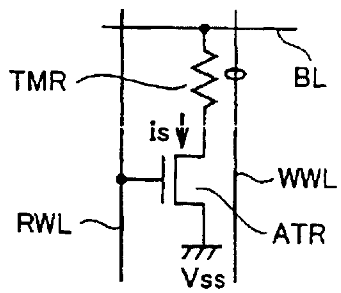
FIG. 22 is a schematic diagram showing a configuration of MTJ memory cell.
Figure 23:
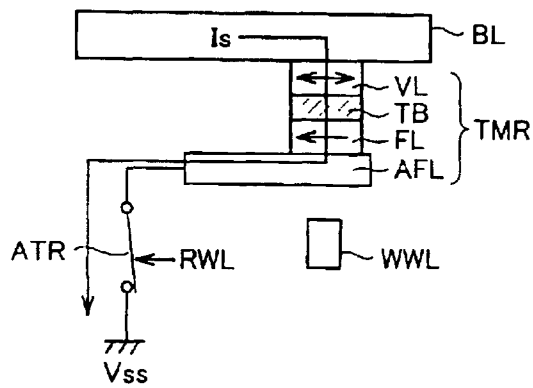
FIG. 23 is a conceptual view explaining a data read operation for reading data from the MTJ memory cell.
Figure 24:
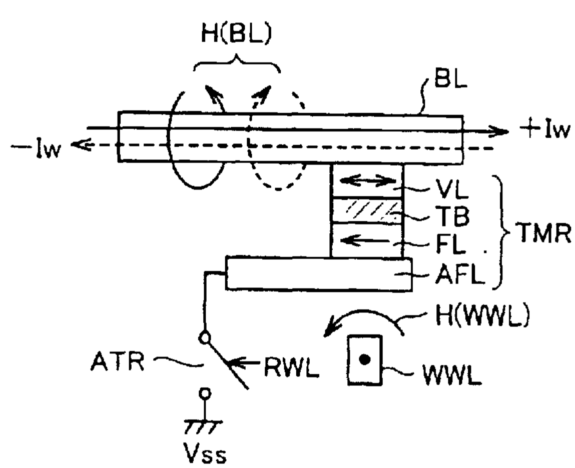
FIG. 24 is a conceptual view explaining a data write operation for writing data to the MTJ memory cell.
Figure 25:
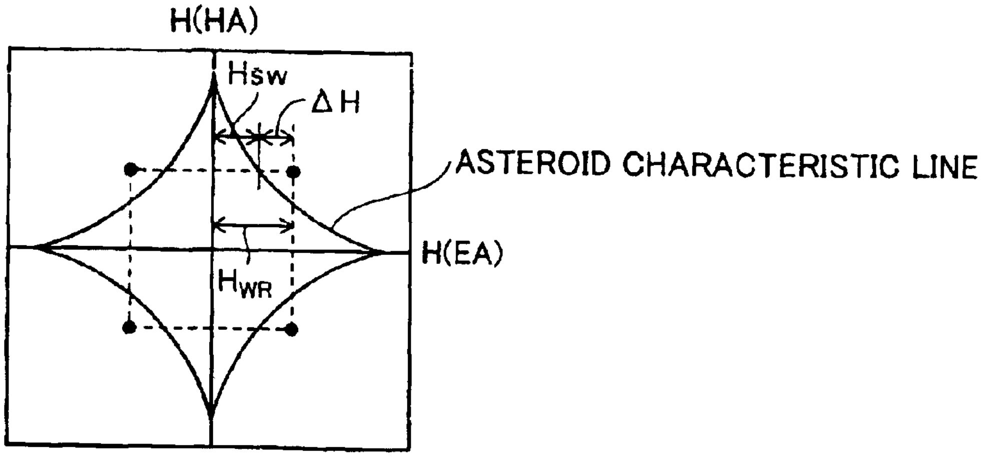
FIG. 25 is a conceptual view explaining the relationship between a data write current and the magnetization direction of a tunneling magneto-resistance element during data write.

Referring to FIG. 2, memory array 10 has MTJ memory cells MC arranged in n rows×m columns (n, m: natural numbers). The configuration of each MTJ memory cell is the same as that shown in FIG. 22. Namely, each MTJ memory cell includes a tunneling magneto-resistance element TMR which functions as a magnetic storage section which electric resistance changes according to the level of stored data, and an access transistor ATR which functions as an access gate.

Read word lines RWL1 to RWLn and write word lines WWL1 to WWLn are provided to correspond to first to $n^{th}$ memory cell rows, respectively. Bit lines BL1, /BL1 to BLm, /BLm which constitute bit line pairs BLP1 to BLPm, are provided to correspond to first to $m^{th}$ memory cell columns, respectively.

In the following description, if the write word line(s), the read word line(s), the bit line(s) and the bit line pair(s) are generally expressed, reference symbols WWL, RWL, BL (/BL) and BLP are used, respectively. To express a specific write word line, a specific read word line, a specific bit line and a specific bit line pair, subscripts are added to the reference symbols denoting these lines to express them by, for example, RWL1, WWL1, BL1 (/BL1) and BLP1, respectively.

MTJ memory cells MC are connected to bit lines BL or /BL in every other column. For example, in case of the MTJ memory cells which belong to the first memory cell column, the MTJ memory cell in the first row is connected to bit line /BL1 and the MTJ memory cell in the second row is connected to bit line BL1. Likewise, the MTJ memory cells in odd rows are connected to bit lines /BL1 to /BLm in the bit line pairs and those in even rows are connected bit lines BL1 to BLm, respectively.

Memory array 10 further includes a plurality of dummy memory cells DMC connected to bit lines BL1, /BL1 to BLM, /BLm, respectively. Dummy memory cells DMC are arranged in two rows×m columns so that each dummy memory cell DMC corresponds to one of dummy read word lines DRWL1 and DRWL2. The dummy memory cells corresponding to dummy read word line DRWL1 are connected to bit lines BL1, BL2 to BLm, respectively. The other dummy memory cells corresponding to dummy read word line DRWL2 are connected to bit lines /BL1, /BL2 to /BLm, respectively.

Each dummy memory cell DMC includes a dummy resistor element TMRd and a dummy access element ATRd. The electric resistance Rd of dummy resistor element TMRd is set at the intermediate value of electric resistances Rmax and Rmin corresponding to data levels "1" and "0" of the stored data in each MTJ memory cell MC, respectively, i.e., set to satisfy the relationship of Rmax>Rd>Rmin. Dummy access element ATRd typically consists of a field effect transistor as in the case of the access element of each MTJ memory cell. Therefore, in the following description, the dummy access element will be also referred to as "dummy access transistor ATRD".

Further, dummy write word lines DWWL1 and DWWL2 are arranged to correspond to the respective columns of dummy memory cells. It is unnecessary to arrange the dummy write word lines depending on the structure of dummy resistor element TMRd. However, to secure the continuity of shape on the memory array and to avoid complicating a manufacturing process, dummy write word lines DWWL1 and DWWL2 designed in the same manner as that of write word lines WWL are provided.

During data read, if a certain odd column is selected in accordance with a column selection result and MTJ memory cells MC are connected to bit lines /BL1 to /BLm, respectively, then dummy read word line DRWL1 is activated and dummy memory cells DMC are connected to bit lines BL1 to BLm, respectively. Conversely, during data read, if a certain even column is selected and MTJ memory cells are connected to bit lines BL1 to BLm, respectively, then dummy read word line DRWL2 is activated and dummy memory cells DMC are connected to bit lines /BL1 to /BLm, respectively.

Dummy read word lines DRWL1 and DRWL2 are sometimes, generally referred to as dummy read word lines DRWL. In addition, the high voltage state (power supply voltages Vcc1, Vcc2 or Vcc3) and the low voltage state (ground voltage Vss) of each of signals and a signal lines may be referred to as "H level" and "L level", respectively.

During data write, word line driver 30 connects one end of write word line WWL corresponding to a selected memory cell column (hereinafter also referred to as "selected column") to power supply voltage Vcc3. As described above, the other end of each write word line WWL is connected to ground voltage Vss in region 40, whereby, it is possible to carry a data write current Ip in a column direction to write word line WWL on the selected column from word line driver 30 toward region 40. On the other hand, word line driver 30 connects unselected write word lines to ground voltage Vss.

During data read, word line driver 30 selectively activates read word line RWL and dummy read word lines DRWL1 and DRWL2 to H level (power supply voltage Vcc1) in accordance with the row selection result.

Then, the column selection operation of MRAM device 1 will be described.

Write column select lines WCSL1 to WCSLm and read column select lines RCSL1 to RCSLm for executing column selection are provided to correspond to first to $m^{th}$ memory cell columns, respectively.

During data write, column decoder 25 activates one of write column select lines WCSL1 to WCSLm to a selected state (H level) in accordance with the decoding result of column address CA, i.e., the column selection result. During data read, column decoder 25 activates one of read column select lines RCSL1 to RCSLm to a selected state (H level) in accordance with the column selection result.

Further, a write data bus pair WDBP transmitting write data and a read data bus pair RDBP transmitting read data are arranged independently of each other. Write data bus pair WDBP includes write data buses WDB and /WDB complementary to each other and read data bus pair RDBP includes read data buses RDB and /RDB complementary to each other.

Read/write control circuit 50 includes a data write circuit 51W and a data read circuit 51R as well as read column select gates RCSG1 to RCSGm and write column select gats WCSG1 to WCSGm provided to correspond to the respective memory cell columns.

Since read column select gates RCSG1 to RCSGm arranged to correspond to the respective memory cell columns are the same configuration and write column select gates WCSG1 to WCSGm arranged to correspond to the respective memory cell columns are the same in configuration, the configurations of read column select gate RCSG1 and write column select gate WCSG1 provided to correspond to bit lines BL1 and /BL1 will be typically described.

Read column select gate RCSG1 includes a transistor switch which is electrically connected between read data bus RDB and bit line BL1 and a transistor switch which is electrically connected between read data bus /RDB and bit line /BL1. These transistor switches are turned on and off according to the voltage of read column select line RCSL1. That is, if read column select line RCSL1 is activated to a selected state (H level), read column select gate RCSG1 electrically connects read data buses RDB and /RDB to bit lines BL1 and /BL1, respectively.

Write column select gate WCSG1, which is similar in configuration to read column select gate RCSG1, includes two transistors which are turned on and off according to the voltage of write column select line WCSL1. If write column select line WCSL1 is activated to a selected state (H level), write select gate WCSG1 electrically connects write data buses WDB and /WDB to bit lines BL1 and /BL1, respectively.

In the following description, read column select lines RCSL1 to RCSLm, write column select lines WCSL1 to WCSLm, read column select gates RCSG1 to RCSGm and write column select gates WCSG1 to WCSGm will be also referred to as general terms of read column select lines RCSL, write column select lines WCSL, read column select gates RCSG and write column select gates WCSG, respectively.

Read/write control circuit 60 includes short-circuit switch transistors 62-1 to 62-*m* provided to correspond to the memory cell columns, respectively. Short-circuit switch transistors 62-1 to 62-*m* are turned on and off in response to write column select lines WCSL1 to WCSLm, respectively. For example, short-circuit switch transistor 62-1, which is provided to correspond to the first memory cell column, electrically connects one ends (opposite side to write column select gate WCSG1) of bit lines BL1 and /BL1 to each other in response to the activation (H level) of write column select line WCSL1.

Likewise, short-circuit switch transistors 62-2 to 62-*m* provided to correspond to the other memory cell columns, respectively, electrically connect one ends of bit lines BL and /BL, constituting respective bit line pairs BLP, to each other, respectively.

Read/write control circuit 60 further includes precharge transistors 64-1*a*, 64-1*b* to 64-*ma*, 64-*mb* provided between bit lines BL1, /BL1 to BLm, /BLm and ground voltage Vss, respectively. Precharge transistors 64-1*a*, 64-1*b* to 64-*ma*, 64-*mb* are turned on in response to the activation of a bit line precharge signal BLPR to thereby precharge bit lines BL1, /BL1 to BLm, /BLm with ground voltage Vss, respectively.

In the following description, short-circuit switch transistors 62-1 to 62-*m* and precharge transistors 64-1*a*, 64-1*b* to 64-*ma*, 64-*mb* will be also referred to as general terms of short-circuit switch transistors 62 and precharge transistors 64, respectively.

Bit line precharge signal BLPR generated by control circuit 5 is activated to H level in a predetermined period before the execution of data read while MRAM device 1 is active. On the other hand, bit line precharge signal BLPR is inactivated to L level and precharge transistors 64 are turned off during the data read operation and the data write operation while MRAM device 1 is active.

Next, the configuration of the data read circuit and that of the data write circuit will be described.

Figure 3:
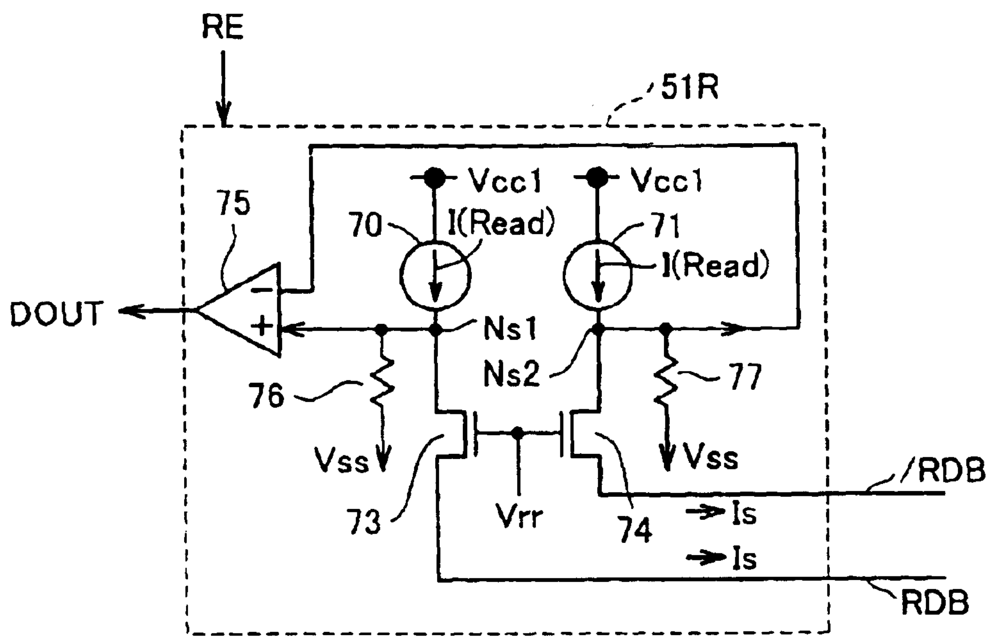
FIG. 3 is a circuit diagram showing a configuration of a data read circuit shown in FIG. 2.

Referring to FIG. 3, data read circuit 51R includes constant current supply circuits 70 and 71 which receive power supply voltage Vcc1 and supply a constant current I (Read) to internal nodes Ns1 and Ns2, respectively, an N-type MOS transistor 73 which is electrically connected between internal node Ns1 and read data bus RDB, an N-type MOS transistor 74 which is electrically connected between internal node Ns2 and data bus /RDB, and an amplifier 75 which amplifies the voltage level difference between internal nodes Ns1 and Ns2 and outputs read data DOUT.

Figure 4:
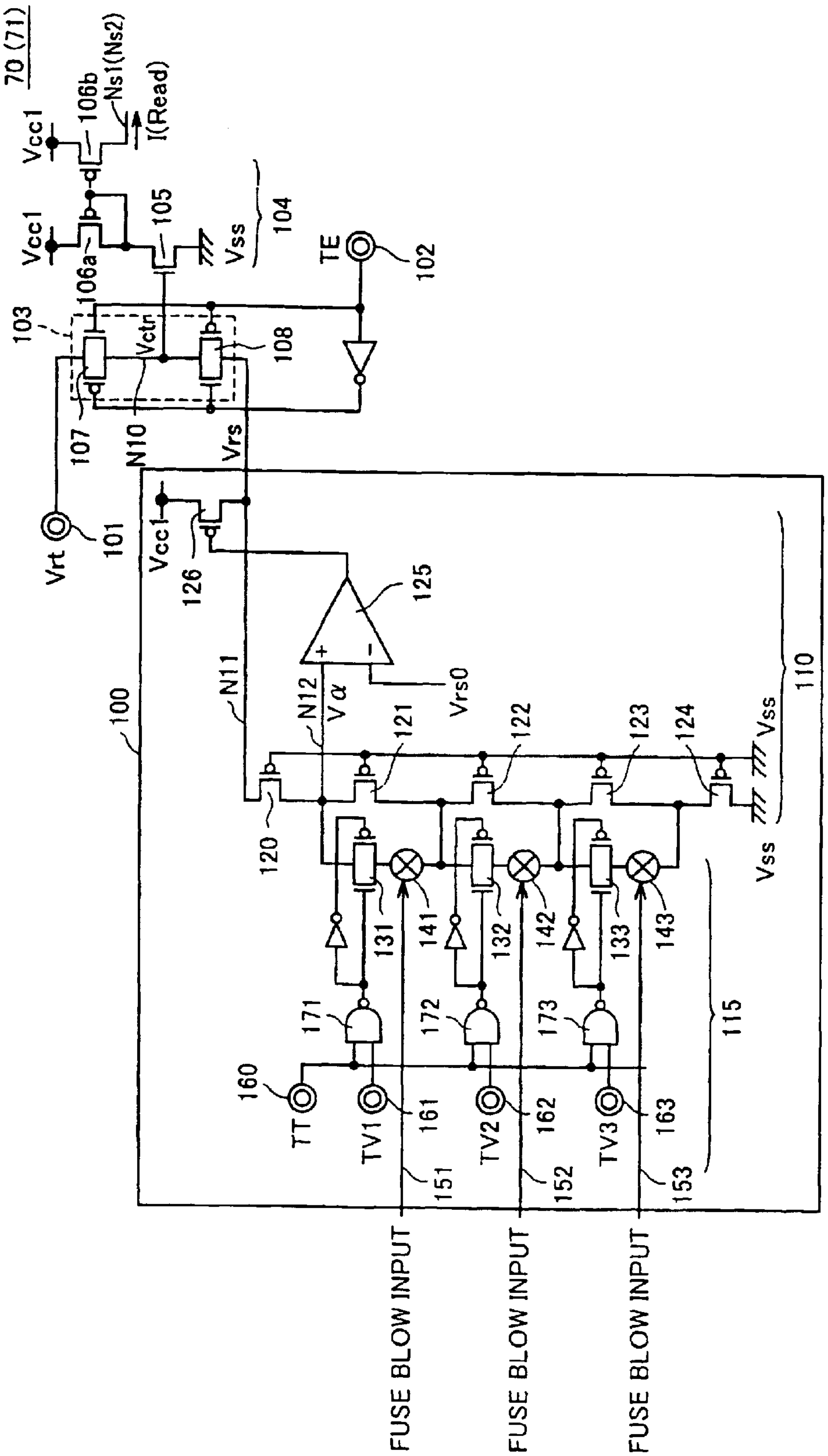
FIG. 4 is a circuit diagram showing a configuration of constant current supply circuits 70 and 71 shown in FIG. 3.

Since constant current supply circuits 70 and 71 are the same in configuration, FIG. 4 typically shows the configuration of constant current supply circuit 70.

Referring to FIG. 4, constant current supply circuit 70 includes a voltage adjustment circuit 100 which adjusts a reference voltage Vrs, input terminals 101 and 102, a voltage switch circuit 103, and a current source 104 which generates a constant current I(Read) in accordance with a control voltage Vctr transmitted to voltage switch circuit 103 at an internal node Ns1.

Voltage adjustment circuit 100 generates reference voltage Vrs for setting the quantity of data read current Is in normal operation. In a test mode, a test reference voltage Vrt for setting the quantity of sense current Is is inputted into input terminal 101. A test entry signal TE, which is activated to H level in the test mode and inactivated to L level in normal operation, is inputted into input terminal 102.

Voltage switch circuit 103 includes transfer gates 107 and 108 which are complementarily turned on and off in response to test entry signal TE. Voltage switch circuit 103 transmits, as control voltage Vctr, reference voltage Vrs from voltage adjustment circuit 100 to a node N10 in response to test entry signal TE in the normal operation. On the other hand, voltage switch circuit 103 transmits, as control voltage Vctr, test reference voltage Vrt applied to input terminal 101 to node N10 in the test mode.

Current source 104 includes an N-channel MOS transistor 105 and P-channel MOS transistors 106*a* and 106*b*. N-channel MOS transistor 105 and P-channel MOS transistor 106*a* are connected in series between power supply voltage Vcc1 and ground voltage Vss. The gate of N-channel MOS transistor 105 is connected to node N10. The connection node of connecting N-channel MOS transistor 105 to P-channel MOS transistor 106*a* is connected to the gates of P-channel MOS transistors 106*a* and 106*b*.

Because of the current mirror configuration as described above, current source 104 supplies constant current I(Read) in accordance with control voltage Vctr of node N10 to internal node Ns1.

With the above-mentioned configuration, the quantity of sense current Is carried to internal node Ns1 (Ns2) is set in accordance with reference voltage Vrs outputted from voltage adjustment circuit 100 in the normal operation and set in accordance with test reference voltage Vrt inputted into input terminal 101 from externally in the test mode.

Voltage adjustment circuit 100 includes a voltage adjustment section 110 and a tuning input section 115. Voltage adjustment section 110 adjusts reference voltage Vrs in accordance with the setting of tuning input section 115.

Voltage adjustment section 110 includes P-channel MOS transistors 120 to 124 connected in series between a node N11 which generates reference voltage Vrs and ground voltage Vss, an operational amplifier 125 and a P-channel MOS transistor 126 which is electrically connected between node N11 and power supply voltage Vcc1. Operational amplifier 125 amplifies the voltage difference between a voltage Vα of connection node N12 of connecting P-channel MOS transistors 120 and 121 to each other and a predetermined voltage Vrs0, and outputs the amplified voltage difference to the gate of transistor 126.

The gates of P-channel MOS transistors 120 to 124 are connected to ground voltage Vss, respectively. As a result, each of transistors 120 to 124 functions as a resistor element. If the gate voltage of P-channel MOS transistor 126 is controlled in accordance with the output of operational amplifier 125, the voltage level of reference voltage Vrs is controlled so that the voltage of node N12 is equal to predetermined voltage Vrs0. Predetermined voltage Vrs0 is set in light of reference voltage Vrs.

Here, voltage Vα of node N12 is obtained by dividing reference voltage Vrs by transistors 120 to 124 which respectively function as resistor elements. If this voltage division ratio is defined as α (α=Vrs/Vα), reference voltage Vrs is expressed as Vrs=α×Vrs0 using predetermined voltage Vrs0 inputted into operational amplifier 125.

Voltage division ratio α is determined by the ratio of a resistance value between node N11 and ground voltage Vss to a resistance value between node N12 and ground voltage Vss. The resistance value ratio is programmable in accordance with the input to tuning input section 115 from externally.

In this way, by not directly programming reference voltage Vrs but programming voltage division ratio a in relation to the input voltage to operational amplifier 125, it is possible to improve the response and noise resistance of reference voltage Vrs.

Tuning input section 115 includes pairs of fuse elements, as program element, and transfer gates which are provided in parallel to transistors 121 to 123, respectively. For example, transfer gate 131 and fuse element 141 are serially connected in parallel to transistor 121. Transfer gate 132 and fuse element 142 connected serially, are arranged in parallel to transistor 122. Likewise, transfer gate 133 and fuse element 143 connected serially, are arranged in parallel to transistor 123.

Fuse elements 141 to 143 are blown in response to the incidence of laser light from externally or the application of a high-voltage signal from externally through blow input nodes 151 to 153, respectively, thereby changing a conductive state to a nonconductive state.

Tuning input section 115 also includes an input terminal 160 which receives a control signal TT activated in a sense current tuning mode, input terminals 161 to 163 which input tuning signals TV1 to TV3, respectively, a control gate 171 which on/off controls transfer gate 131 according to the level of control signal TT and that of tuning signal TV1, a control gate 172 which on/off controls transfer gate 132 according to the level of control signal TT and that of tuning signal TV2, and a control gate 173 which on/off controls transfer gate 133 according to the level of control signal TT and that of tuning signal TV3.

In a normal mode, control signal TT is inactivated to L level and the output signals of control gates 171 to 173 are fixed to H level, respectively. In response to the levels of control gates 171 to 173, transfer gates 131 to 133 are turned on, respectively. Therefore, voltage division ratio α is determined in accordance with the states (conductive states or nonconductive states) of fuse elements 141 to 143, respectively.

If control signal TT is activated to H level, the output signals of control gates 171 to 173 are set to L level in response to tuning signals TV1 to TV3, respectively, making it possible to turn off corresponding transfer gates 131 to 133, respectively. If control signal TT and tuning signal TV1 are activated to H level, for example, transfer gate 131 can be turned off and a pseudo state equivalent to a state in which fuse element 141 is blown, can be created. Likewise, pseudo blown states (nonconductive states) can be created for fuse elements 142 and 143, respectively.

As a result, in tuning input section 115, voltage division ratio α is changed in accordance with control signal TT and tuning signals TV1 to TV3 and reference voltage Vrs for adjusting the quantity of the sense current can be variably set.

In the tuning mode, therefore, it is possible to reversibly adjust voltage division ratio α in response to the input of a digital signal and to easily adjust the quantity of the current without actually blowing the fuse elements.

After the end of the tuning mode, if the fuse elements are actually blown based on a tuning result, it is possible to program reference voltage Vrs for obtaining an appropriate sense current to voltage adjustment circuit 100 in a nonvolatile manner. As a result, in the normal mode, voltage adjustment circuit 100 generates appropriate reference voltage Vrs programmed by fuse blow. Therefore, even if the manufacturing irregularity of tunneling film thickness or the like exists, it is possible to appropriately secure a sufficient data read margin.

The number of transistors for setting voltage division ratio α is not limited to the number shown in FIG. 4 but can be set at an appropriate number. In this case, if pairs of transfer gates and fuse elements, and control signal input terminals, which are controlled in the same manner, are provided in parallel to an arbitrary number of transistors which function as resistor elements, it is possible to subdivide the setting levels of reference voltage Vrs.

In the configuration of FIG. 4, the fuse elements which turn into nonconductive states after fuse low are shown by way of example. Alternatively, so-called anti-fuse elements can be employed. In that case, if transfer gates 131 to 133 for executing a tuning test are connected in parallel to the anti-fuse elements, respectively, it is possible to attain the same advantage.

Referring back to FIG. 3, a reference voltage Vrr is applied to the gates of N-type MOS transistors 73 and 74, respectively. Resistors 76 and 77 are provided to pull down internal nodes Ns1 and Ns2 to ground voltage Vss, respectively. With such a configuration, data read circuit 51R can supply sense current Is in accordance with I(Read), which can be adjusted by voltage adjustment circuit 100 shown in FIG. 4 in a step-by-step, nonvolatile manner, to read data buses RDB and /RDB during data read.

During data read, each of read data buses RDB and /RDB is pulled down to ground voltage Vss through one of bit lines BL and /BL, one of the selected memory cell and the dummy memory cell. Therefore, data read circuit 51R can read the stored data of the selected memory cell by amplifying the voltage difference between internal nodes Ns1 and Ns2.

Then, the configuration of the data write circuit will be described.

Figure 5:
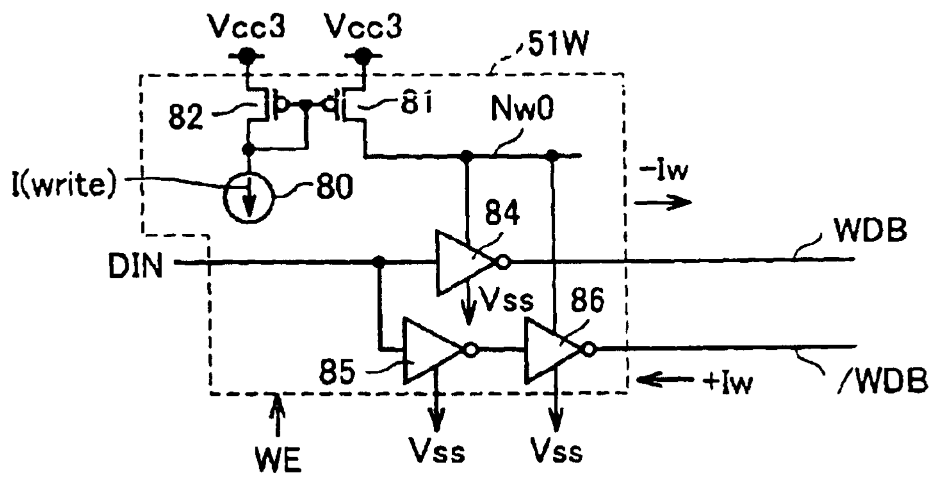
FIG. 5 is a circuit diagram showing a configuration of a data write circuit shown in FIG. 2.

Referring to FIG. 5, data write circuit 51W includes a constant current supply circuit 80 which carries a constant current I (write) and P-channel MOS transistors 81 and 82 which constitute a current mirror. As a result, the quantity of a current supplied to an internal node Nw0 is set according to constant current I (write).

Data write circuit 51W further includes inverters 84, 85 and 86 which operate in response to an operating current through internal node Nw0.

Inverter 84 inverts the voltage level of write data DIN and transmits level-inverted write data DIN to write data bus WDB. Inverter 85 inverts the voltage level of write data DIN and transmits level-inverted write data DIN to the input node of inverter 86. Inverter 86 inverts the output of inverter 84 and transmits the level-inverted output to write data bus /WDB. Therefore, data write circuit 51W sets the voltage of each of write data buses WDB and /WDB at either power supply voltage Vcc3 or ground voltage Vss in accordance with the voltage level of write data DIN.

Figure 6:
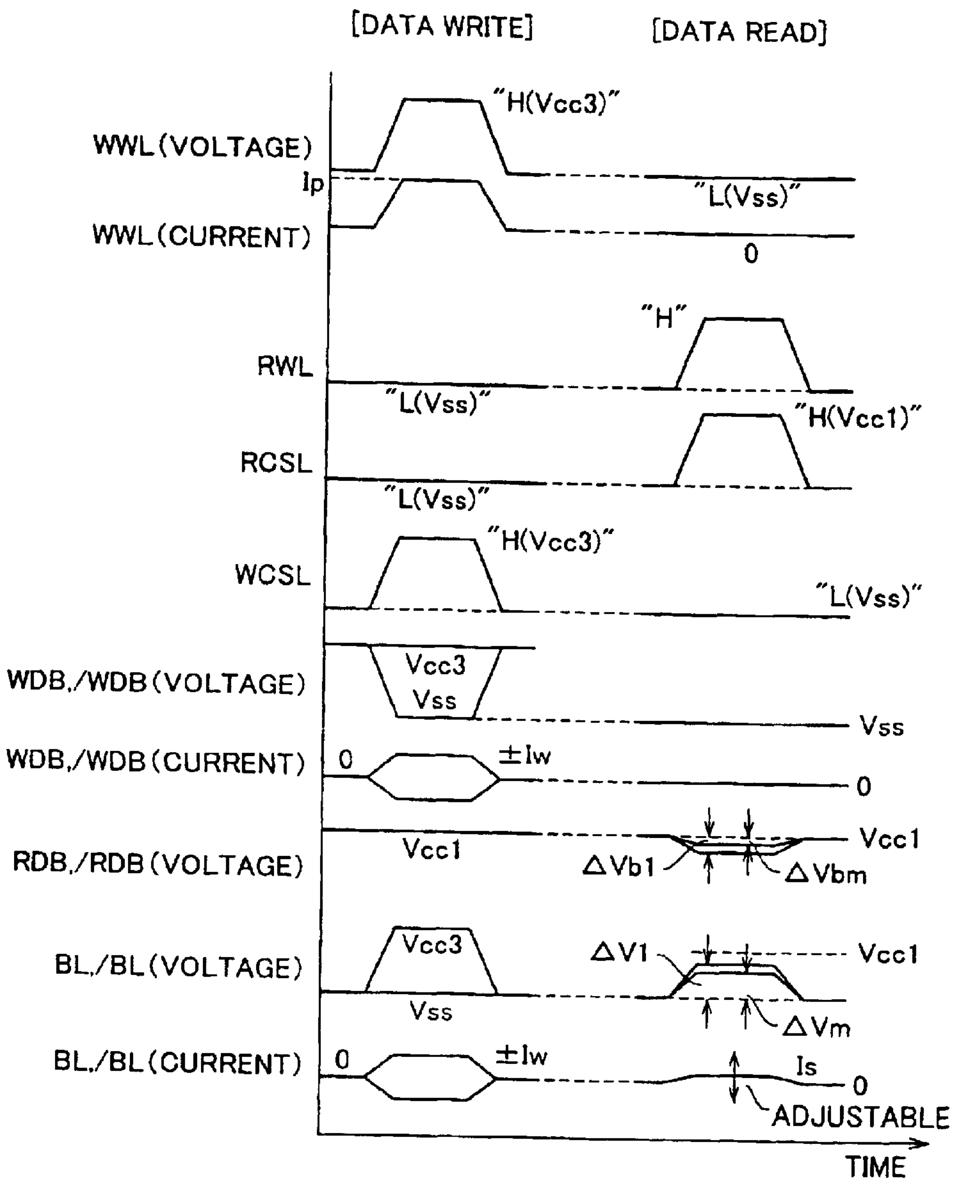
FIG. 6 is a timing chart for explaining the data read operation and the data write operation of the MRAM device according to the first embodiment.

FIG. 6 is a timing chart for explaining the data read operation and the data write operation of MRAM device 1 according to the first embodiment.

The data read operation will first be described.

Before data read, read data buses RDB and /RDB are precharged with power supply voltage Vcc1 and bit lines BL and /BL are precharged with ground voltage Vss.

During data read, one read word line RWL corresponding to a selected memory cell is activated to a selected state (H level) in accordance with a row selection result. As a result, the selected memory cell is electrically connected between one of bit lines BL and /BL and ground voltage Vss. In addition, one of dummy read word line DRWL1 and DRWL2 is activated and the other bit line BL or /BL, which is not connected to MTJ memory cell MC, is connected to dummy memory cell DMC.

On the other hand, write word lines WWL and write column select line WCSL are inactivated to L level (ground voltage Vss), respectively. No current is carried to write word lines WWL and write data buses WDB and /WDB.

As can be seen, during data read, each of bit lines BL and /BL is pulled down to ground voltage Vss through the selected memory cell or dummy memory cell DMC which function as a resistor. In addition, sense current Is is carried to each of bit lines BL and /BL corresponding to the selected memory cell column by data read circuit 51R. As already described above, sense current Is can be adjusted by the fuse blow conducted by voltage adjustment circuit 100.

As a result, voltage changes according to the electric resistance (Rmax or Rmin) of tunneling magneto-resistance element TMR of the selected memory cell occur to bit line BL or /BL and read data bus RDB or /RDB, respectively. Likewise, voltage changes according to the electric resistance Rd of dummy resistor element TMRd of dummy memory cell DMC occur to the other bit line BL or /BL and the other read data bus RDB or /RDB, respectively.

If the level of the stored data of the selected memory cell is, for example, “1” (electric resistance Rmax), one of bit line BL and /BL connected to the selected memory cell has a voltage change ΔV1 (ΔV1>ΔVm) greater than a voltage change ΔVm which occurs to the other bit line BL or /BL connected to dummy memory cell DMC. Likewise, read data buses RDB and /RDB have voltage changes ΔVb1 and ΔVbm, respectively (ΔVbm>ΔVb1).

Data read circuit 51R can sense and amplify the voltage difference between read data buses RDB and /RDB generated as described above and output read data DOUT.

Further, since the precharge voltage of bit lines BL and /BL is ground voltage Vss, no discharge current flows from bit lines BL and /BL in unselected columns through the access transistors turned on in response to the activation of read word line RWL in the selected row. As a result, it is possible to reduce consumption power for charge and discharge following the precharging of bit lines BL and /BL.

Then, the data write operation will be described.

Write column select line WCSL corresponding to a column select result is activated to a selected state (H level) and corresponding write column select gate WCSG is turned on. Accordingly, one ends of bit lines BL and /BL in the selected column corresponding to the selected memory cell are connected to write data buses WDB and /WDB, respectively.

Further, in data write, corresponding short-circuit transistor 62 is turned on to thereby generate short-circuit between the other ends of bit lines BL and /BL (on the opposite side to write column select gate WCSG) in the selected column.

As already described above, data write circuit 51W sets each of write data buses WDB and /WDB at either power supply voltage Vcc3 or ground voltage Vss. If the data level of write data DIN is, for example, L level, data write current −Iw for writing L level data is carried to write data bus WDB. Data write current −Iw is supplied to bit line BL in the selected column through write column select gate WCSG.

Data write current −Iw carried to bit line BL in the selected column is turned back by short-circuit switch transistor 62. As a result, data write current +Iw in opposite direction to that of current −Iw is carried to the other bit line /BL. Data write current +Iw flowing in bit line /BL is transmitted to write data bus /WDB through write column select gate WCSG.

Furthermore, one of write word lines WWL is activated to a selected state (H level: power supply voltage Vcc3) in accordance with a row selection result and data write current Ip is carried to write word line WWL. As a result, data is written to the selected memory cell for which the data write current is carried to corresponding write word line WWL and bit line BL (/BL). The directions of data write currents ±Iw turned back and carried are inverted according to the data level of write data DIN.

During data write, read word lines RWL are kept in unselected states (L level). In addition, even if data is written, the voltages of bit lines BL and /BL for data write are set at ground voltage Vss corresponding to the precharge voltage level for data read by activating bit line precharge signal BLPR to H level.

Likewise, the voltages of read data buses RDB and /RDB are set at power supply voltage Vcc1 corresponding to the precharge voltage for data read. By setting the voltages of bit lines BL and /BL corresponding to the unselected columns and those of read data buses RDB and /RDB for data write, at the precharge voltage for data read, it becomes unnecessary to execute a new precharge operation before reading data and it is, therefore, possible to accelerate the data read operation.

Then, the power supply voltage levels of the data read and data write circuit systems will be described. During data write, data write currents Ip and ±Iw necessary to magnetize tunneling magneto-resistance element TMR of the selected memory cell are higher than sense current Is necessary to read data. Therefore, Vcc3 which is the operating power supply voltage of data write circuit 51W is set higher than Vcc1 which is the operating power supply voltage of data read circuit 51R.

As power supply voltage Vcc3, an external power supply voltage supplied from externally of MRAM device 1, for example, is used as it is. Further, if this external power supply voltage is dropped by a voltage drop circuit, which is not shown, to form a configuration which generates power supply voltage Vcc1, it is possible to efficiently supply power supply voltages Vcc1 and Vcc3.

As described above, according to the first embodiment, sense current Is during data write can be adjusted according to the external input in a nonvolatile manner. It is, therefore, possible to secure a sufficient data read operation margin to correspond to the manufacturing irregularity of the tunneling film thickness of tunneling magneto-resistance element TMR or the like. In addition, it is possible to create a pseudo fuse blown state in response to the input of an external electrical signal, thereby making it possible to efficiently execute the tuning operation for tuning sense current Is.

(Modification of First Embodiment)

In a modification of the first embodiment, the configuration of MRAM device 1 in which sense current Is can be monitored during adjustment will be described.

Figure 7:
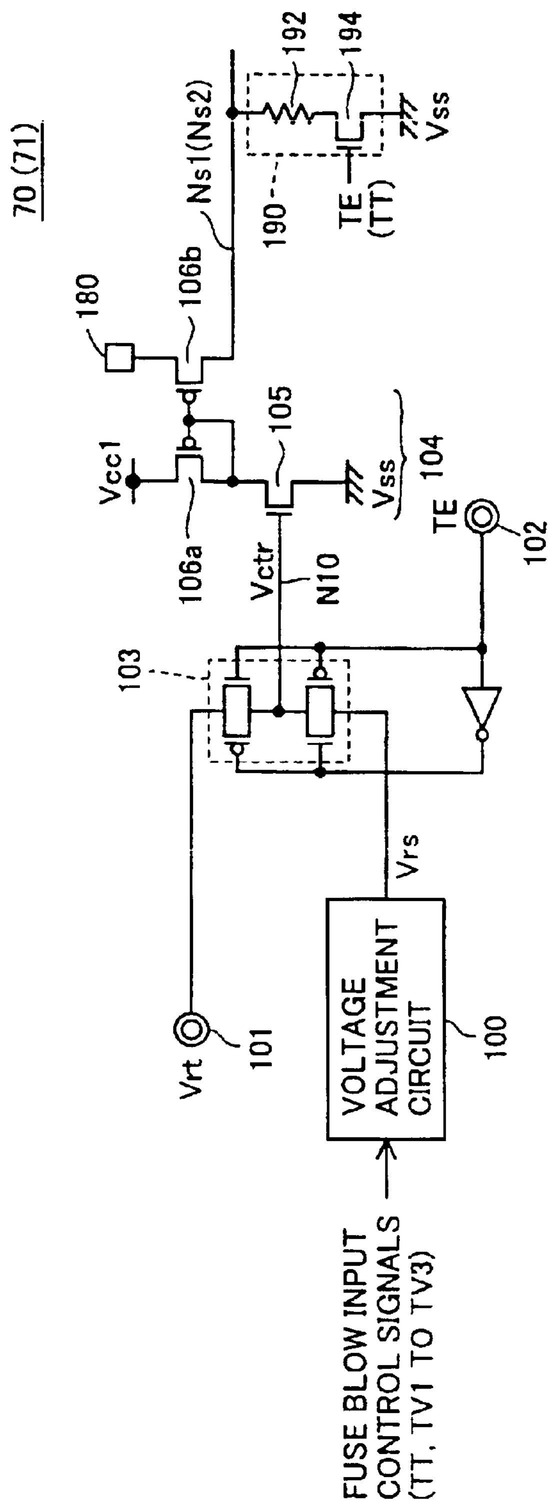
FIG. 7 is a circuit diagram showing a configuration of constant current supply circuits 70 and 71 according to a modification of the first embodiment.

Referring to FIG. 7, the configuration of constant current supply circuit 70 (71) included in data read circuit 51R in the modification of the first embodiment differs from the configuration thereof described in the first embodiment in that a current monitor section 190 which monitors the quantity of a current flowing in an internal node Ns1 (Ns2) is provided besides the constituent elements shown in FIG. 4. Since the other constituent elements of constant current supply circuits 70 and 71 are the same as those shown in FIG. 4, they will not be described herein repeatedly. In addition, since the constituent elements of data read circuit 51R other than constant current supply circuits 70 and 71 are the same as those shown in FIG. 3, they will not be described herein repeatedly.

Current monitor section 190 includes a monitor resistor 192 having a known resistance value and a transistor switch 194 which are connected in series, between internal node Ns1 (Ns2) and ground voltage Vss. Test entry signal TE is inputted into the gate of transistor switch 194. Accordingly, during test mode entry, monitor resistor 192 is electrically connected between internal node Ns1 and ground voltage Vss.

According to the configuration of constant current supply circuit 70 (71) in the modification of the first embodiment, P-channel MOS transistor 106*b* which supplies a constant current to internal node Ns1 is electrically connected between internal node Ns1 and a terminal 180 which can be electrically contacted from externally. In a normal operation, power supply voltage Vcc1 is supplied to terminal 180. In a test mode, terminal 180 is applied a predetermined voltage and resulting current flow of terminal 180 is measured from externally.

By adopting such a configuration, it is possible to efficiently adjust sense current Is based on the known resistance value of monitor resistor 192 and the current flow of node Ns1 measured through terminal 180 while monitoring the quantity of the current supplied from constant current supply circuit 70 (71).

With the alternative configuration of constant current supply circuit 70 (71) in which control signal TT shown in FIG. 4 is inputted into the gate of transistor switch 194, even if voltage adjustment circuit 100 creates a pseudo fuse blown state to execute the tuning of sense current Is, it is possible to obtain the same advantage as that described above.

Figure 8:
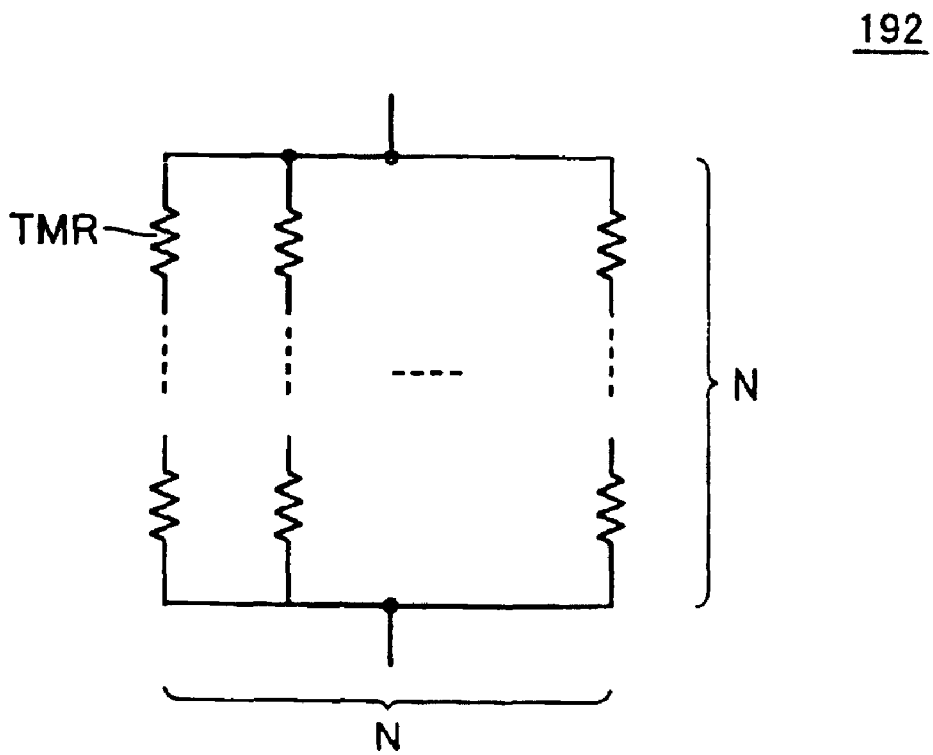
FIG. 8 is a circuit diagram showing a configuration example of a monitor resistor show in FIG. 7.

Referring to FIG. 8, monitor resistor 192 is constituted out of (N×N) (N: an integer not less than 2) tunneling magneto-resistance elements TMR which are connected in series and in parallel. As tunneling magneto-resistance elements TMR, those manufactured in the same manner as tunneling magneto-resistance element TMR in MTJ memory are employed.

By constituting monitor resistor 192, to which an excessive current is possibly carried, to include a plurality of tunneling magneto-resistance elements TMR connected in series, it is possible to prevent monitor resistor 192 from being broken.

Further, according to the configuration shown in FIG. 8, the electric resistance of monitor resistor 192 can be set equivalent to that of each MTJ memory cell. It is, therefore, possible to efficiently adjust sense current Is in conditions closer to those in the normal operation.

(Second Embodiment)

In a second embodiment, a configuration of an MRAM device 1 for efficiently executing a defect acceleration test (hereinafter, referred to as "burn-in test") conducted to screen a tunneling film in a tunneling magneto-resistance element TMR will be described.

Figure 9:
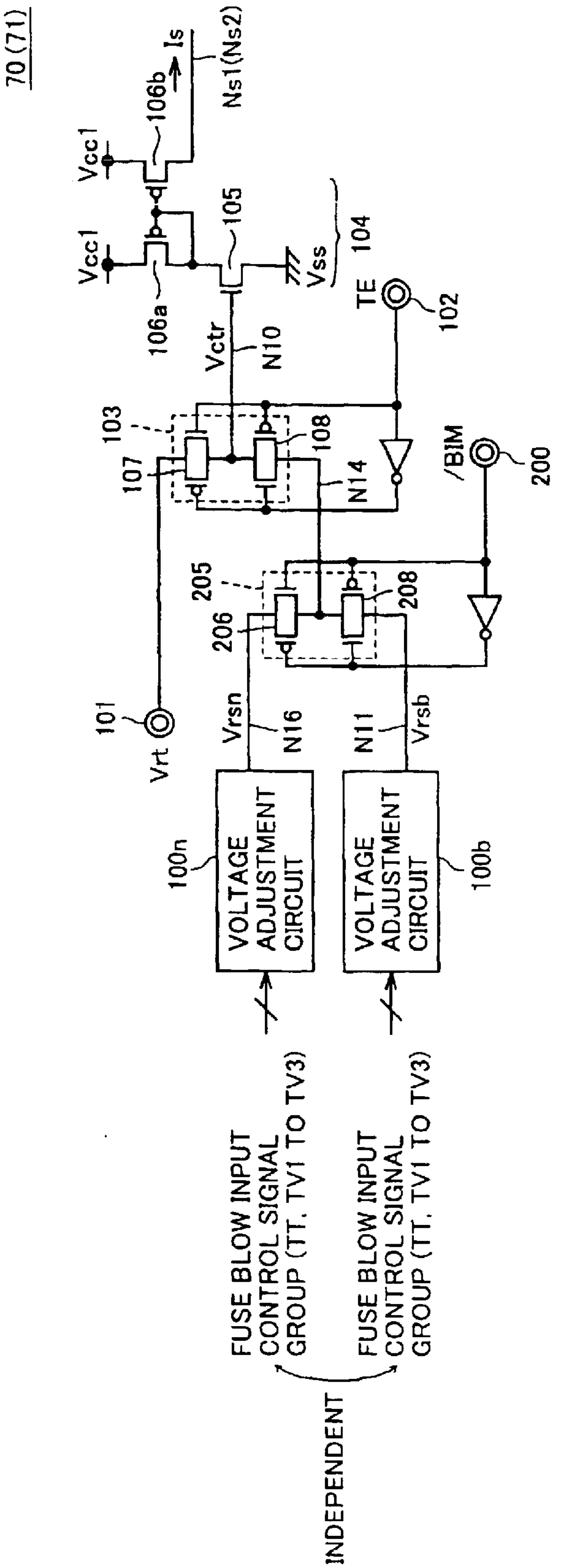
FIG. 9 is a circuit diagram showing the configuration of constant current supply circuits 70 and 71 according to a second embodiment of the present invention.

Referring to FIG. 9, a configuration of a constant current supply circuit 70 (71) in the second embodiment differs from that in the first embodiment shown in FIG. 4 in that constant current supply circuit 70 (71) includes a voltage adjustment circuit 100*n* which generates a reference voltage Vrsn for adjusting a constant current I (Read) in normal operation (also referred to as "normal operation mode") and a voltage adjustment circuit 100*b* which generates a reference voltage Vrsb for adjusting constant current I (Read) in a burn-in test (also referred to as "burn-in mode").

Constant current supply circuit 70 (71) in the second embodiment also includes an input terminal 200 which receives the input of a burn-in mode signal /BIM activated to L level in the burn-in mode, and a voltage switch circuit 205.

Voltage adjustment circuits 100*n* and 100*b* are the same in configuration as a voltage adjustment circuit 100 shown in FIG. 4. Voltage adjustment circuit 100*n* outputs reference voltage Vrsn to a node N16 in accordance with a group of control signals for fuse blow inputs and pseudo-fuse blow. Likewise, voltage adjustment circuit 100*b* outputs a reference voltage Vrsb to a node N11. It is noted, however, that the group of control signals (corresponding to a control signal TT and tuning signals TV1 to TV3 shown in FIG. 4) for fuse blow inputs and pseudo-fuse blow for voltage adjustment circuits 100*n* and 100*b* are set independently of one another.

Voltage switch circuit 205 includes transfer gates 206 and 207 complementarily turned on and off in response to burn-in mode signal /BIM. Voltage switch circuit 205 transmits reference voltage Vrsn outputted from voltage adjustment circuit 100*n* to a node N14 in response to burn-in mode signal /BIN in the normal operation mode. Voltage switch circuit 205 transmits reference voltage Vrsb outputted from voltage adjustment circuit 100*b* to node N14 in the burn-in mode. Each of reference voltages Vrsb and Vrsn transmitted to node N14 is transmitted, as a control voltage Vctr, to a gate of an N-channel MOS transistor 105.

With the above-mentioned configuration, if reference voltage Vrsb corresponding to the burn-in mode is set higher than reference voltage Vrsn corresponding to the normal operation mode, a tunnel current (also referred to as "burn-in current") which passes through the tunneling film in each tunneling magneto-resistance element TMR during a burn-in test can be set higher than sense current Is which passes through the tunneling film during the data read operation in the normal operation mode. It is, therefore, possible to apply a current stress higher than that in the normal operation mode to the tunneling film of each MTJ memory cell. As a result, it is possible to efficiently execute a defect acceleration test for clarifying the potential defect of the tunneling film, which test is necessary to improve the reliability of MRAM device 1.

Reference voltage Vrsb corresponding to the burn-in mode can be inputted into voltage switch circuit 205 through an input terminal (not shown) electrically connected to an node N11 and provided in the same fashion as that of an input terminal 101 into which a test reference voltage Vrt is inputted. However, by using voltage adjustment circuit 100*b* which is the same in configuration as voltage adjustment circuit 100 described with reference to FIG. 4, it is possible to facilitate the adjustment of the tunnel current in the burn-in test.

(First Modification of Second Embodiment)

In a first modification of the second embodiment, a row selection operation and a column selection operation for efficiently execute the burn-in test will be described.

Figure 10:
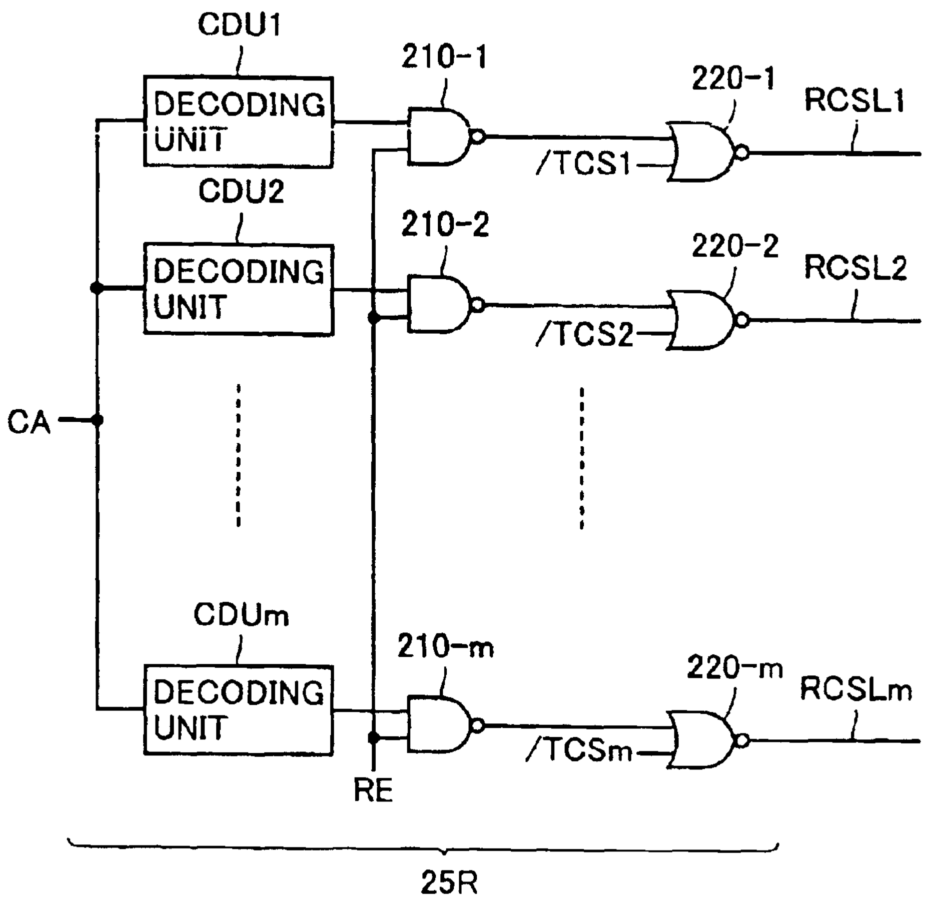
FIG. 10 is a circuit diagram showing a configuration of a column decoder according to a first modification of the second embodiment.

FIG. 10 shows a configuration of a read column decoding section 25R which controls the activation of read column select lines RCSL1 to RCSLm, in a column decoder 25 in the first modification of the second embodiment.

Referring to FIG. 10, read column decoding section 25R includes decoding units CDU1 to CDUm, control gates 210-1 to 210-*m* and drive gates 220-1 to 220-*m* provided to correspond to memory cell columns, respectively.

If a corresponding memory cell column is selected in response to an input of a column address CA, the output of each of decoding units CDU1 to CDUm is activated to H level. Each of control gates 210-1 to 210-*m* receives the output of one of corresponding decoding units CDU1 to CDUm and a control signal RE activated to H level during data read, and outputs the result of a NAND logical operation for the one output and control signal RE. By adopting such a configuration, it is possible to share decoding units CDU1 to CDUm between read column decoding section 25R and a write column decoding section (not shown) for respectively controlling write column select lines WCSL1 to WCSLm.

Drive gates 220-1 to 220-*m* drive read column select lines RCSL1 to RCSLm in accordance with the results of NAND logical operations for the outputs of control gates 210-1 to 210-*m* and test column select signals /TCS1 to /TCSm, respectively.

During data write during which control signal RE is inactivated to L level, the outputs of respective control gates 210-1 to 210-*m* are fixed to H level irrespectively of a column selection result. In modes other than the burn-in mode, test column select signals /TCS1 to /TCSm are inactivated to H level.

In the normal operation mode, therefore, read column decoding section 25R inactivates each of read column select lines RCSL1 to RCSLm to L level during data write. In addition, read column decoding section 25R activates corresponding read column select line RCSL in a memory cell column for which the output signal from corresponding one of control gates 210-1 to 210-*m* becomes L level, i.e., a selected memory cell column having an L level output signal from control gates 210-1 to 210-*m*, to H level.

In the burn-in mode, a plurality of signals among test column select signals /TCS1 to /TCSm are activated to L level. In response to the activation thereof, a plurality of read column select lines RCSL are forced to be activated. As a result, during the burn-in test, by forcedly selecting a plurality of memory cell columns, it is possible to cause tunnel currents to pass through many MTJ memory cells in parallel and to thereby efficiently execute the burn-in test in a short period of time.

While FIG. 10 shows an example in which test column select signals /TCS1 to /TCSm are set independently according to the respective memory cell columns, it is also possible to set the overall memory cell columns into a plurality of column groups and to set test column select signals /TCS1 to /TCSm according to the respective column groups. In that case, it is possible to execute the burn-in test to the tunneling films in respective tunneling magneto-resistance elements TMR for each group.

Figure 11:
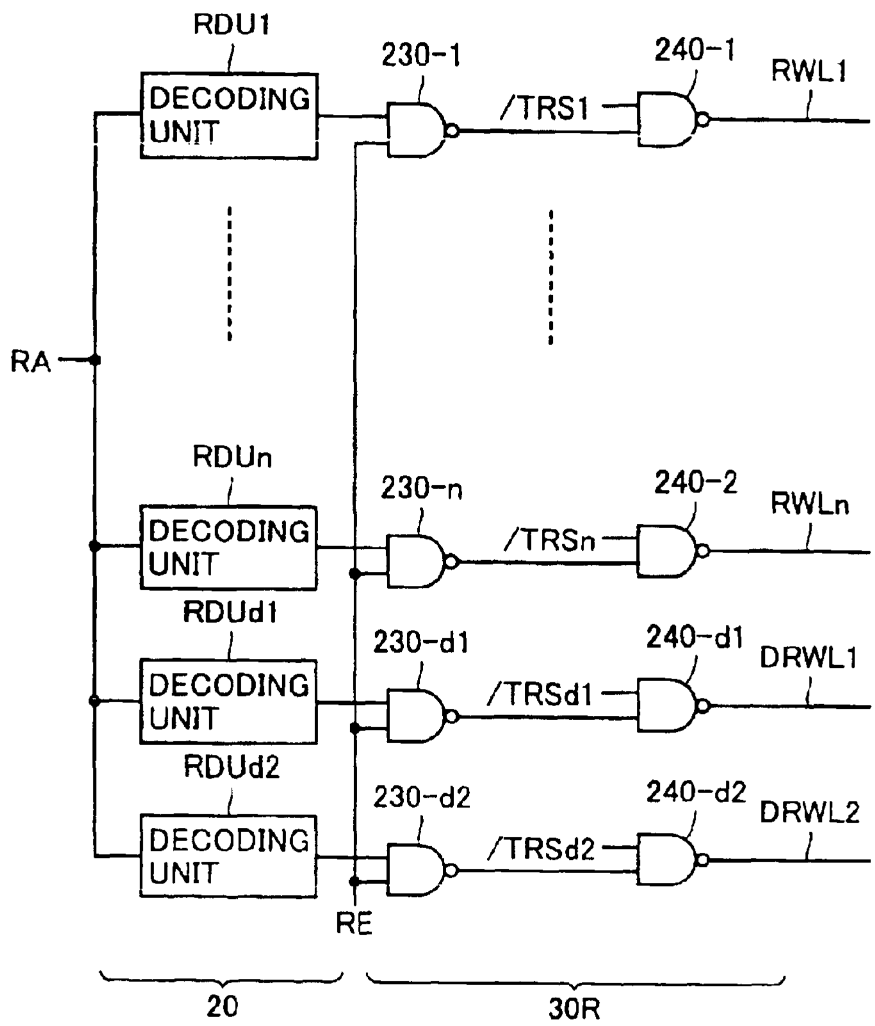
FIG. 11 is a circuit diagram showing a first configuration example of a word line driver according to the first modification of the second embodiment.

FIG. 11 shows the configuration of a read word line driving section 30R in a word line driver 30 which section controls the activation of read word lines RWL1 to RWLn and dummy read word lines DRWL1 and DRWL2.

Referring to FIG. 11, a row decoder 20 includes decoding units RDU1 to RDUn, RDUd1 and RDUd2 provided to correspond to memory cell rows and dummy memory cell rows, respectively. The output of each decoding unit is activated to H level if a corresponding memory cell row or dummy cell row is selected in response to the input of a row address RA.

Read word driving section 30R includes control gates 230-1 to 230-*n*, 230-*d*1 and 230-*d*2 and drive gates 240-1 to 240-*n*, 240-*d*1 and 240-*d*2, provided corresponding to memory cell row and dummy cell row, respectively.

Each of control gates 230-1 to 230-*n*, 230-*d*1 and 230-*d*2 receives the output of the corresponding decoding unit and control signal RE and outputs the result of an NAND logical operation for the output and control signal RE. Drive gates 240-1 to 240-*n*, 240-*d*1 and 240-*d*2 drive read word lines RWL1 to RWLn and dummy read word lines DRWL1 and DRWL2 in accordance with the results of NAND logical operations for the outputs of control gates 230-1 to 230-*n*, 230-*d*1 and 230-*d*2 and test row select signals /TRS1 to /TRSn, /TRSd1 and /TRSd2, respectively.

During data write during which control signal RE is inactivated to L level, the outputs of respective control gates 230-1 to 230-*n*, 230-*d*1 and 230-*d*2 are fixed to H level, irrespectively of a row selection result. In modes other than the burn-in mode, each of test row select signals /TRS1 to /TRSn, /TRSd1 and /TRSd2 is inactivated to H level.

In the normal operation mode, therefore, read word line driving section 30R inactivates read word lines RWL1 to RWLn and dummy read word lines DRWL1 and DRWL2 to L level, respectively, in data write. In data read, read word line driving section 30R activates corresponding read word line RWL and dummy read word line DRWL in the memory cell row and the dummy memory cell row for which the output signals from the corresponding control gates become L level, i.e., in the selected memory cell row and dummy memory cell row, to H level.

In the burn-in mode, at least a plurality of signals among test row select signals /TRS1 to /TRSn are activated to L level. A plurality of read word lines RWL are forced to be activated to correspond to the activation thereof to L level. As a result, by forcedly selecting a plurality of memory cell rows in the burn-in test, it is possible to cause tunnel currents to pass through many MTJ memory cells in parallel and to efficiently execute the burn-in test in a short period of time.

While FIG. 11 shows an example in which the test column select signals and test row select signals are set for the respective memory cell rows and dummy memory cell rows, it is also possible to divide the entire memory cell rows and dummy memory cell rows into a plurality of row groups and to set the test row select signals for the respective row groups. If so, it is possible to execute the burn-in test to the tunneling film in each tunneling magneto-resistance element TMR for each group.

Figure 12:
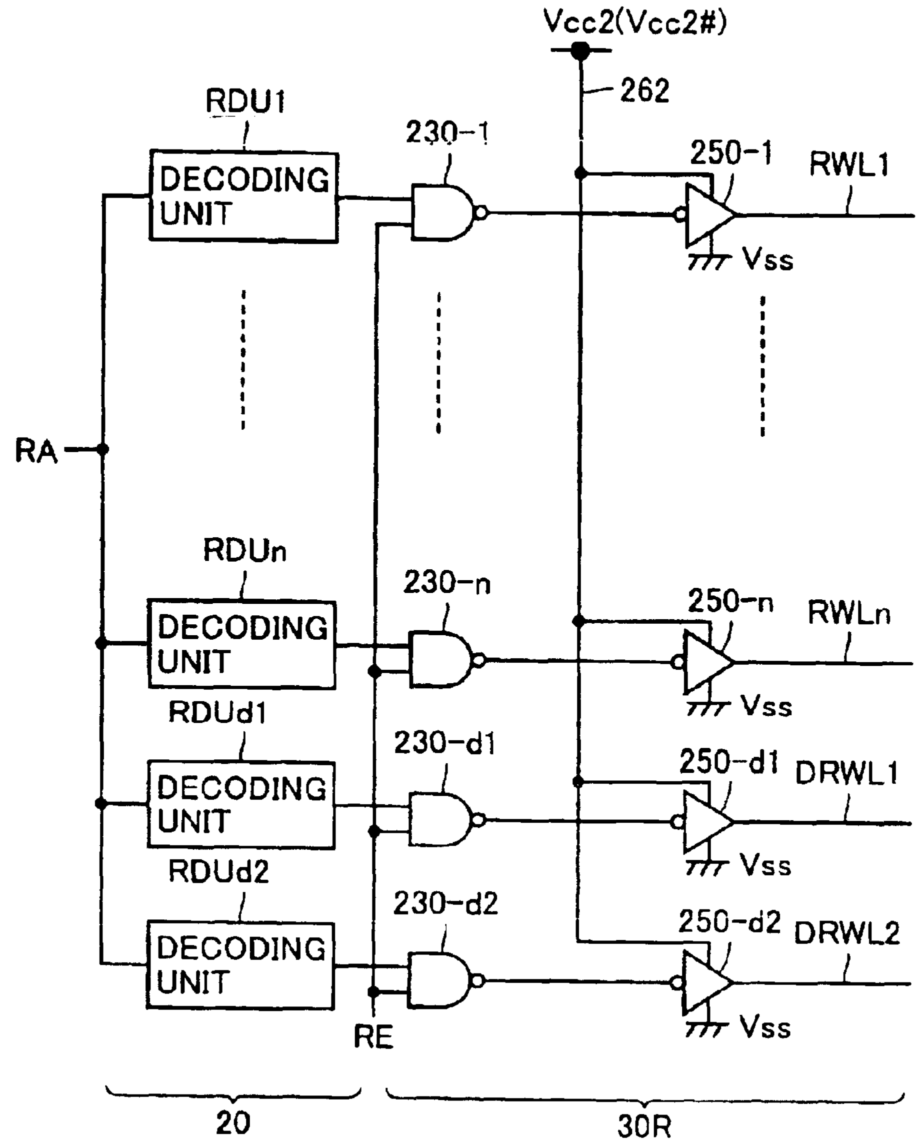
FIG. 12 is a circuit diagram showing a second configuration example of the word line driver according to the first modification of the second embodiment.

FIG. 12 shows the other example of the configuration of read word line drive section 30R in the word line driver in the first modification of the second embodiment.

Referring to FIG. 12, in read word line drive section 30R in the second configuration example, drive gates 250-1 to 250-*n*, 250-*d*1 and 250-*d*2 each consisting of an inverter are arranged to correspond to read word lines RWL1 to RWLn and dummy read word lines DRWL1 and DRWL2, respectively. Each of drive gates 250-1 to 250-*n*, 250-*d*1 and 250-*d*2 operates in response to an operating voltage supplied from a power supply node 262.

Drive gates 250-1 to 250-*n*, 250-*d*1 and 250-*d*2 invert the outputs of corresponding control gates 230-1 to 230-*n*, 230-*d*1 and 230-*d*2 and drive corresponding read word lines RWL and dummy read word lines DRWL, respectively.

Therefore, the operation of read word line drive section 30R shown in FIG. 12 is the same as the operation of word line drive section 30R shown in FIG. 11 in a normal operation.

In the burn-in mode, a power supply voltage higher than that supplied in the normal operation mode is supplied to power supply node 262. If power supply voltage Vcc2 is supplied to power supply node 262 in the normal operation mode, for example, power supply voltage Vcc2# higher than Vcc2 is supplied to power supply node 262 in the burn-in mode.

By adopting the above-mentioned configuration, it is possible to set the gate voltage of each access transistor or dummy access transistor for causing a tunnel current to pass in the burn-in mode, to be higher than the voltage in the normal operation mode. It is thereby possible to prevent the decrease of the tunnel current in the burn-in mode due to obstruction, i.e., the ON-resistance of the access transistors and dummy access transistors. As a result, it is possible to carry a higher tunnel current in the burn-in mode than that the normal operation mode and to, therefore, efficiently execute the tunneling film burn-in test. Alternatively, in the configuration of FIG. 12, drive gates 250-1 to 250-*n*, 250-*d*1 and 250-*d*2 may be replaced by drive gates 240-1 to 240-*n*, 240-*d*1 and 240-*d*2 shown in FIG. 11 and the operating voltage of each of these drive gates may be supplied from power supply node 262.

(Second Modification of Second Embodiment)

By decreasing the R-C load of the sense current path during data read, voltage change necessary for reading data is swiftly caused to thereby make it possible to accelerate reading data from the MRAM device. In the second modification of the second embodiment, a technique for efficiently conducting a burn-in test to a memory array of a so-called read gate structure adopted to this end will be described.

The memory array of a read gate structure will first be described in detail.

Figure 13:
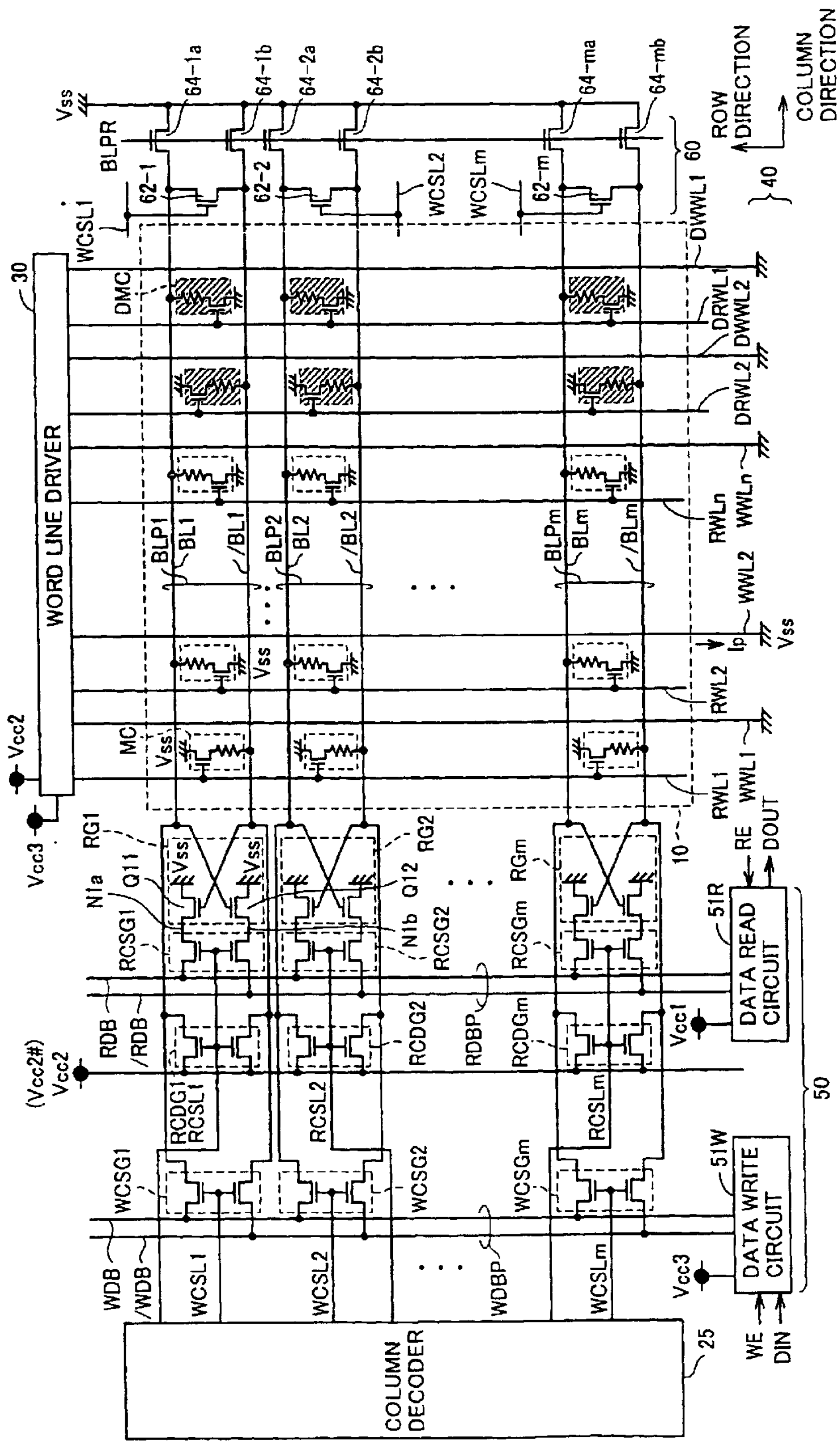
FIG. 13 is a circuit diagram showing a configuration of a memory array having a read gate structure and peripheral circuits thereof.

Referring to FIG. 13, in the memory array of the read gate structure, read drive select gates RCDG1 to RCDGm and read gates RG1 to RGm are arranged to correspond to memory cell columns, respectively, in addition to the configuration shown in FIG. 2. In the following description, read gates RG1 to RGm and read drive select gates RCDG1 to RCDGm will be also generally referred to as read gates RG and read drive select gates RCDG, respectively.

In respective memory cell columns, read drive select gates RCDG are the same in configuration and read gates RG are the same in configuration. Therefore, the configurations of read drive select gate RCDG1, read gate RG1 and write column select gate WCSG1 provided to correspond to bit lines BL1 and /BL1 will be typically described herein.

Read drive select gate RCDG1 includes transistor switches electrically connected between bit lines BL1 and /BL1 and power supply voltage Vcc2, respectively. These transistor switches are turned on and off according to the voltage level of read column select line RCSL1. That is, if read column select line RCSL1 is activated to a selected state (H level), read drive select gate RCDG1 electrically connects bit lines BL1 and /BL1 to power supply voltage Vcc2.

Read column select gate RCSG1 and read gate RG1 are connected in series between read data buses RDB, /RDB and ground voltage Vss. Read column select gate RCSG1 includes a transistor electrically connected between read data bus RDB and a node N1*a* and a transistor switch electrically connected between read data bus /RDB and a node N1*b*. These transistor switches are turned on and off according to the voltage level of read column select line RCSL1. That is, if read column select line RCSL1 is activated to a selected state (H level), read column select gate RCSG1 electrically connects read data buses RDB and /RDB to nodes N1*a* and N1*b*, respectively.

Read gate RG1 includes N-type MOS transistors Q11 and Q12 electrically connected between node N1*a* and ground voltage Vss and between node N1*b* and ground voltage Vss, respectively. The gates of transistors Q11 and Q12 are connected to bit lines /BL and BL, respectively. Therefore, nodes N1*a* and N1*b* are driven to ground voltage Vss by driving forces according to the voltages of bit lines /BL1 and BL1, respectively.

Specifically, if the voltage of bit line BL1 is higher than that of bit line /BL1, node N1*b* is driven to ground voltage Vss more strongly by transistor Q12 and the voltage of node N1*a*, therefore, becomes higher than that of node N1*b*. Conversely, if the voltage of bit line BL1 is lower than that of bit line /BL1, the voltage of node N1*b* becomes higher than that of node N1*a*.

Since the remaining constituent elements of memory array 10 are the same as those shown in FIG. 2, they will not be repeatedly described in detail.

Figure 14:
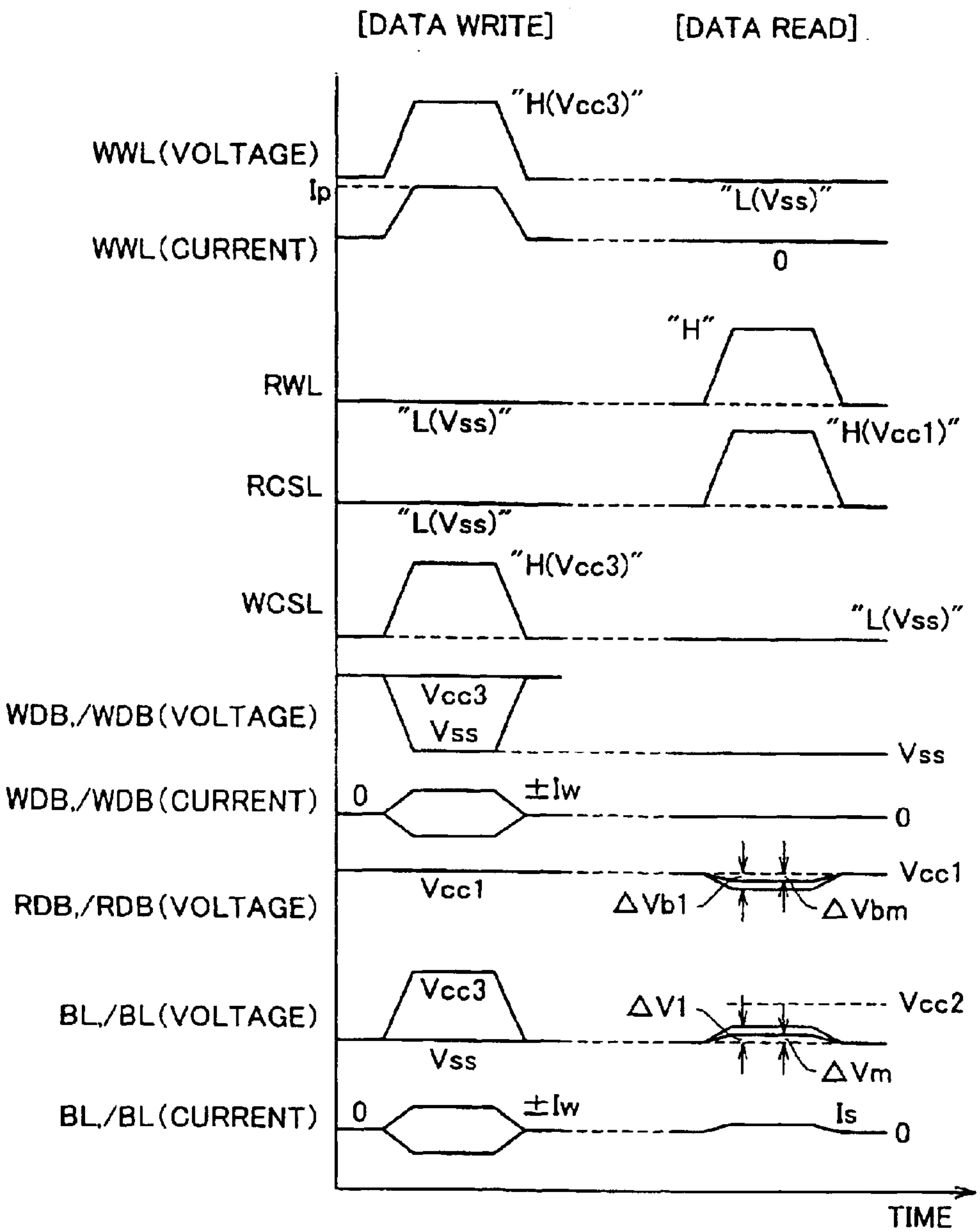
FIG. 14 is a timing chart explaining the data read operation and the data write operation of an MRAM device having the read gate structure.

FIG. 14 is a timing chart for describing the data read operation and data write operation of the MRAM device having the read gate structure.

Referring to FIG. 14, before data read, read data buses RDB and /RDB and bit lines BL and /BL are precharged as in the same manner as that shown in FIG. 6. Further, since write word line WWL, read word line RWL, read column select line RCSL and write column select line WCSL are controlled in the same manner as that shown in FIG. 6 during data read, no detailed description will be given herein.

Therefore, during data read, bit lines BL and /BL are pulled down to ground voltage Vss through the selected memory cell or dummy memory cell DMC functioning as a resistor. In the selected memory cell column, corresponding bit lines BL and /BL are pulled up to power supply voltage Vcc2 by read drive select gate RCDG. The voltages of bit lines BL and /BL are, therefore, determined according to the balance between a pull-up force (pull-up to Vcc2) and a pull-down force (pull-down to Vss), i.e., the magnitude of electric resistance of the selected memory cell or the dummy memory cell serving as a resistor.

If the stored data level of the selected memory cell is, for example, "1" (electric resistance Rmax), one of bit lines BL and /BL connected to the memory cell has greater voltage change ΔV1 than the voltage change ΔVm of the other bit line BL or /BL connected to dummy memory cell DMC. The relative relationship between the voltages of bit lines BL and /BL which constitute bit line pair BLP corresponding to the selected memory cell changes according to the level of the read stored data of the memory cell. The potentials of read data buses RDB and /RDB are driven by read gate RG according to such a voltage difference between bit lines BL and /BL.

If the voltage of bit line BL is higher than that of bit line /BL, for example, read data bus /RDB is driven more strongly than read data bus RDB to ground voltage Vss by read gate RG (voltage change ΔVb1>voltage change ΔVbm in FIG. 14).

The voltage difference thus generated between read data buses RDB and /RDB can be amplified by data read circuit 51R and H-level read data DOUT can be outputted.

Conversely, if the selected memory cell maintains the stored data level of "0" (electric resistance Rmin), i.e., the voltage of bit line /BL is higher than that of bit line BL, then read data bus RDB is driven more strongly than read data bus /RDB to ground voltage Vss by read gate RG. Based on the voltage difference thus generated between read data buses RDB and /RDB, L level read data DOUT can be outputted.

As described above, by constituting the memory array to drive the potentials of read data buses RDB and /RDB through read gate RG, it is possible to exclude read data buses RDB and /RDB each having a high parasitic capacitance, from the sense current path of current flowing in the selected memory cell (or dummy memory cell) and in the bit lines and to execute data read. By doing so, it is possible to decrease the R-C load of the sense current path passing through the selected memory cell and the dummy memory cell and to swiftly cause voltage changes necessary for data read on bit lines BL and /BL. As a result, it is possible to accelerate data read and accelerate access from and to the MRAM device.

Furthermore, power supply voltage Vcc2 for pulling up bit lines BL and /BL during data read is determined so as to suppress the voltage applied to the both ends of tunneling magneto-resistance element TMR in each MTJ memory cell. Normally, if the reliability of the insulating film which serves as the tunnel barrier of each tunneling magneto-resistance element is considered, it is necessary to set the bias voltage thereof to be not higher than about 400 mV. As a result, it is possible to accelerate data read operation while ensuring the operation reliability of each MTJ memory cell.

Moreover, voltage Vcc1 which is the operating power supply voltage of data read circuit 51R is set higher than Vcc2 which is the pull-up voltage of bit lines BL and /BL, i.e., set to satisfy Vcc1>Vcc2 so as to decrease the amplitude of each bit line to suppress the voltage applied to the both ends of the tunneling magneto-resistance element and to increase the amplitude voltage of read data buses RDB and /RDB. In addition, power supply voltage Vcc2 can be supplied using a voltage drop circuit which is not shown as in the case of power supply voltage Vcc1.

Since the data write operation is the same as that shown in FIG. 6, no detailed description will be repeated herein.

Then, a burn-in test for each tunneling film in the memory array having the read gate structure described above will be described.

With the configuration shown in FIG. 13, for example, it is possible to set tunnel current during the burn-in test to be higher than that in the normal operation mode by raising the pull-up voltage of bit lines BL and /BL from Vcc2 to Vcc2#. During such a burn-in test, however, it is difficult to directly adjust the tunnel current for the burn-in mode.

Referring back to FIG. 13, during the burn-in test, a higher tunnel current than that in the normal operation mode is intended to be carried to each MTJ memory cell. Due to this, with the configuration of the memory array in the second modification of the second embodiment, it is also possible to supply the tunnel current for the burn-in test to each MTJ memory cell through bit lines BL and /BL using not data read circuit 51R but data write circuit 51W which functions to adjust the quantity of supplied current. In particular, since power supply voltage Vcc3 which is the operating voltage of data write circuit 51W is higher than power supply voltage Vcc2 used to pull up bit lines and power supply voltage Vcc1 which is the operating voltage of the data read circuit in the normal operation mode, it is possible to generate a high tunnel current more efficiently.

To conduct the above-mentioned burn-in test, it is necessary to activate at least part of write column select gates WCSL1 to WCSLm and inactivate read column select lines RCSL1 to RCSLm in the burn-in mode. If so, it is possible to supply a tunnel current from data write circuit 51W to each MTJ memory cell in the memory cell column for which read word line RWL is activated and in the dummy memory cell column for which dummy read word line DRWL is activated through write data bus pair WDBP and corresponding bit lines BL and /BL.

Figure 15:
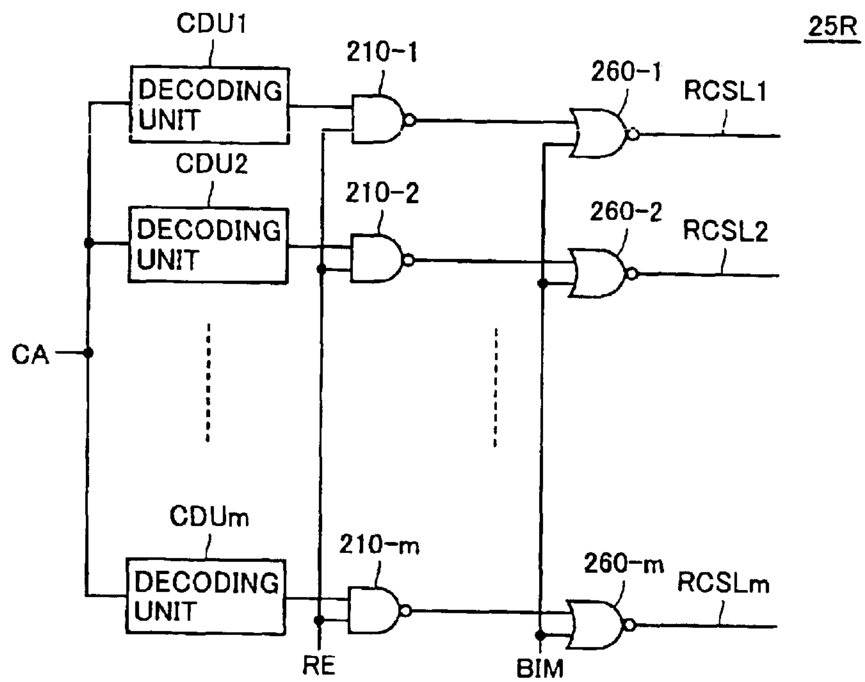
FIG. 15 is a circuit diagram showing a configuration of a read column decoding section in a column decoder according to the second modification of the second embodiment.

FIG. 15 shows the configuration of read column decoding section 25R in the column decoder in the second modification of the second embodiment.

Referring to FIG. 15, read column decoding section 25R in the second modification of the second embodiment differs from read column decoding section 25R shown in FIG. 10 in that drive gates 260-1 to **260-*m* are used instead of drive gates 220-1 to 220-*m*. Since the remaining constituent elements of read column decoding section 25R are the same as those shown in FIG. 10**, they will not be repeatedly described herein in detail.

Each of drive gates 260-1 to **260-*m* activates corresponding read column select line RCSL in accordance with the output of corresponding one of control gates 210-1 to 210-*m*** and the result of an NOR operation for burn-in mode signal BIM.

Accordingly, during the burn-in test during which burn-in mode signal BIM is set at H level, each of read column select lines RCSL1 to RCSLm is inactivated to L level. On the other hand, in the normal operation mode in which burn-in mode signal BIM is set at L level, the activation control of each of read column select gates RCSL1 to RCSLm is the same as that in read column decoding section 25R shown in FIG. 10.

Figure 16:
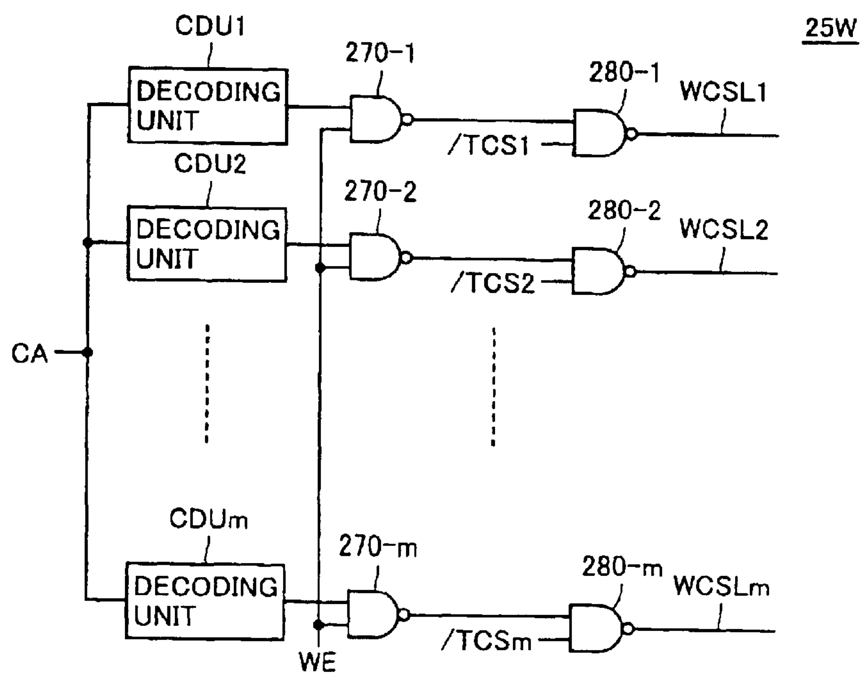
FIG. 16 is a circuit diagram showing a configuration of a write column decoding section in the column decoder in the second modification of the second embodiment.

Referring to FIG. 16, write column decoding section 25W for controlling the activation of write column select lines WCSL1 to WCSLm includes decoding units CDU1 to CDUm shared between write column decoding section 25W and read column decoding section 25R as well as control gates 270-1 to **270-*m* and drive gates 280-1 to 280-*m*** provided to correspond to memory cell columns, respectively.

Each of control gates 270-1 to **270-*m* receives the output of corresponding one of decoding units CDU1 to CDUm and control signal WE activated to H level during data write, and outputs an NAND operation result for the output of the corresponding one of decoding units CDU1 to CDUm and control signal WE activated to H level during data write. Drive gates 280-1 to 280-*m* drive write column select lines WCSL1 to WCSLm in accordance with NAND logical operation results for the outputs of control gates 270-1 to 270-*m*** and test column select signals /TCS1 to /TCSm, respectively.

During data read during which control signal WE is inactivated to L level, the output of each of control gates 270-1 to **270-*m* is fixed to H level irrespectively of a column selection result. The setting of test column select signals /TCS1 to /TCSm is the same as that described with reference to FIG. 10**, it will not be, therefore, described herein repeatedly.

In the normal operation mode, therefore, write column decoding section 25W inactivates write column select lines WCSL1 to WCSLm to L level during data read. During data write in the normal operation mode, write column select decoding section 25W activates write column select lines WCSL1 to WCSLm to H level.

In the burn-in mode, a plurality of write column select lines WCSL are forced to be activated in response to test column select signals /TCS1 to /TCSm, respectively. As a result, during the burn-in test, a plurality of memory cell columns are forced to be selected and corresponding bit line pairs and write data bus pairs WDBP are thereby connected. As described with reference to FIG. 5, the voltage of one write data bus in write data bus pair DBP is set at power supply voltage Vcc3 by data write circuit 51W. It is, therefore, possible to carry tunnel current to MTJ memory cells corresponding to a selected memory cell column in parallel and to conduct the burn-in test efficiently.

During the above-mentioned burn-in test, the quantity of current supplied by the data write circuit can be set to differ between the normal operation mode and the burn-in mode, whereby it is possible to facilitate adjusting a current stress applied to the tunneling film during the burn-in test.

Figure 17:
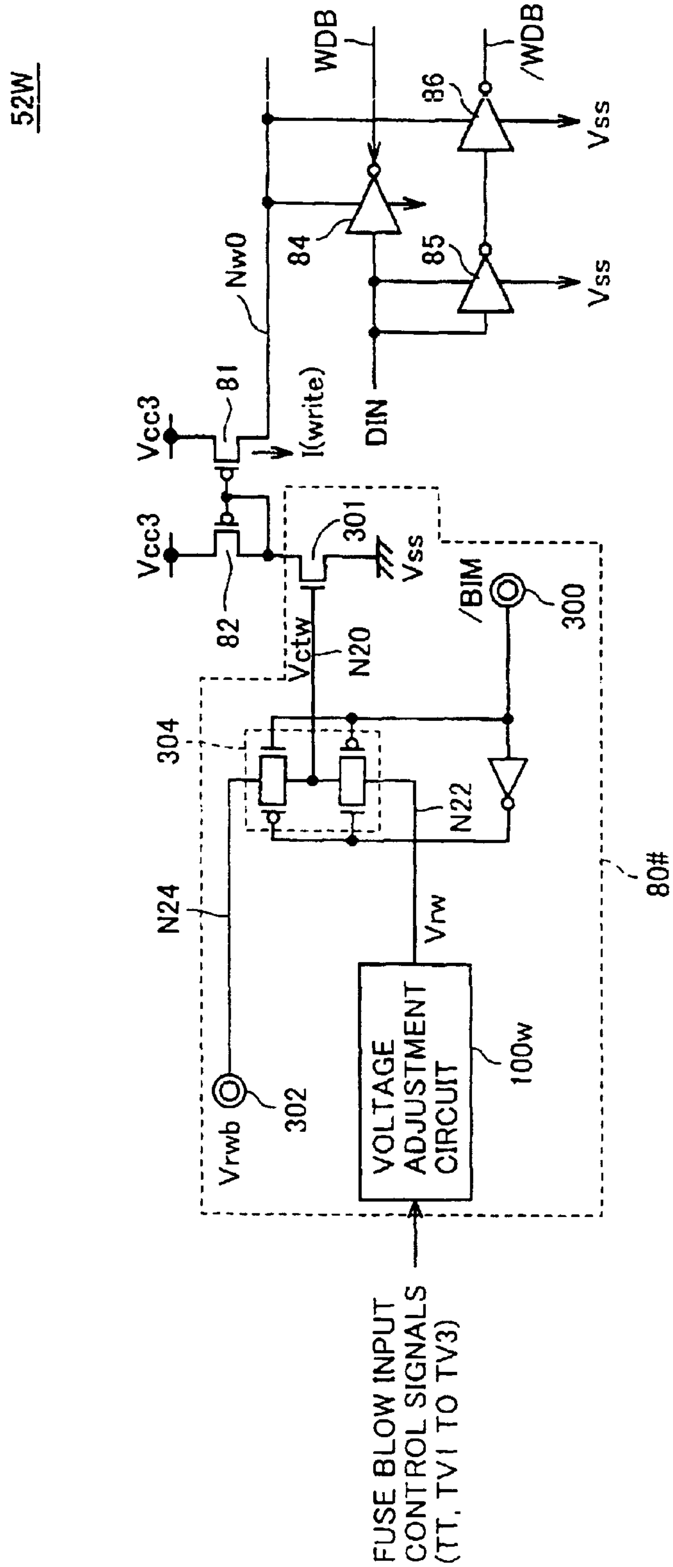
FIG. 17 is a circuit diagram showing a configuration of a data write circuit according to the second modification of the second embodiment.

Data write circuit 52W in the second modification of the second embodiment shown in FIG. 17 can be arranged in place of data write circuit 51W in the configuration shown in FIG. 13.

Referring to FIG. 17, the configuration of data write circuit 52W in the second modification of the second embodiment differs from data write circuit 51W shown in FIG. 5 in that a constant current supply circuit 80# is arranged in place of constant current supply circuit 80. Since the remaining constituent elements and operation of data write circuit 52W are the same as those of data write circuit 51W, they will not be repeatedly described herein.

Constant current supply circuit 80# has the similar configuration as constant current supply circuits 70 or 71 shown in FIG. 4. Namely, constant current supply circuit 80# includes input terminals 300 and 302, a voltage adjustment circuit 100W, a voltage switch circuit 304 and an N-channel MOS transistor 301.

Voltage adjustment circuit **100*w* has the same configuration as voltage adjustment circuit 100 shown in FIG. 4. Namely, voltage adjustment circuit 100W outputs a reference voltage Vrw in accordance with fuse blow inputs and control signals supplied from externally, to a node N22. Burn-in mode signal /BIM activated to L level during the burn-in test is inputted into input terminal 300. Input terminal 302 is electrically connected to a node N24 and a reference voltage Vrwb used during the burn-in test is inputted into input terminal 302**.

Voltage switch circuit 304 connects one of nodes N22 and N24 to a node N20 in response to burn-in mode signal /BIM, and thereby generates an externally adjustable control voltage Vctw at node N20. In the burn-in mode, reference voltage Vrtb inputted into input terminal 302 is transmitted, as control voltage Vctw, to node N20. In the normal operation mode, reference voltage Vrw from voltage adjustment circuit 100W is transmitted, as control voltage Vctw, to node N20.

N-channel MOS transistor 301 is connected in series to a P-channel MOS transistor 82 between power supply voltage Vcc3 and ground voltage Vss and the gate of transistor 301 is connected to node N20. The connection node connecting N-channel MOS transistor 301 to P-channel MOS transistor 82 is connected to the respective gates of P-channel MOS transistors 81 and 82.

By adopting the above-mentioned configuration, the quantity of current I (write) supplied to an internal node Nw0 changes according to control voltage Vctw transmitted to node N20. It is, therefore, possible to adjust data write currents ±Iw in the normal operation mode in response to external inputs and to adjust tunnel current during the burn-in test according to reference voltage Vrwb inputted into input terminal 302. As a result, it is possible to adjust the current stress applied to the tunneling film during the burn-in test from externally.

Alternatively, voltage adjustment circuit **100*b* shown in FIG. 9 may be arranged in place of input terminal 302 to thereby generate reference voltage Vrwb at node N24**.

(Third Modification of Second Embodiment)

In the second embodiment, the configuration of the MRAM device which can set and adjust tunnel current passing through the tunneling film in the normal operation mode and the burn-in mode independently of each other, has been described. In the third modification of the second embodiment, the configuration of the MRAM device which can maintain a ratio of current stresses applied to the tunneling film to be constant in the normal operation mode (data read) and the burn-in mode.

Figure 18:
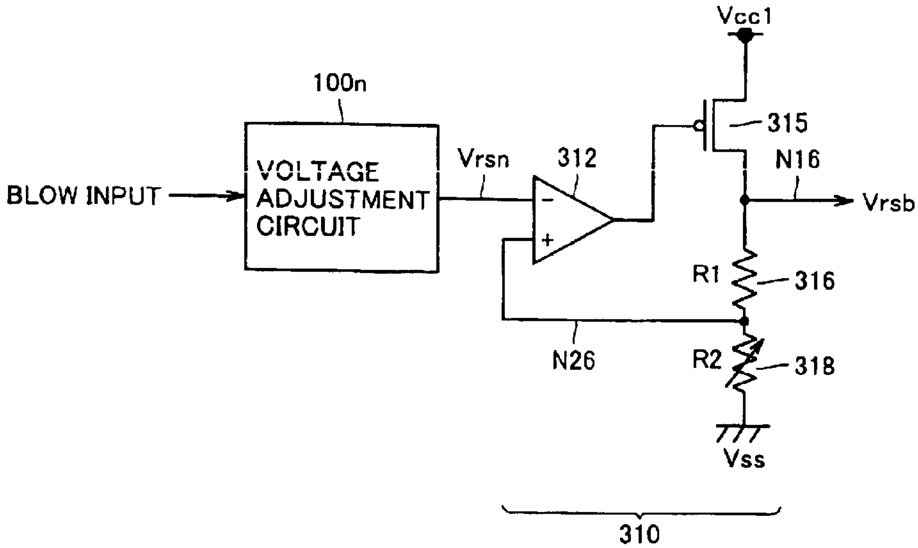
FIG. 18 is a circuit diagram showing a configuration of a voltage adjustment circuit 310 for a burn-in mode according to a third modification of the second embodiment.

A voltage adjustment circuit 310 for the burn-in mode shown in FIG. 18 in the third modification of the third embodiment is arranged in place of voltage adjustment circuit **100*b* in the configuration of, for example, constant current supply circuit 70 or 71 shown in FIG. 9**.

Referring to FIG. 18, voltage adjustment circuit 310 in the third modification of the third embodiment receives a reference voltage Vrsn outputted from voltage adjustment circuit **100*n*** for the normal operation mode, and multiplies reference voltage Vrsn by a predetermined rate K (K: a real number greater than 1) to thereby generate reference voltage Vrsb.

Voltage adjustment circuit 310 includes an operational amplifier 312, a P-channel MOS transistor 315 and resistor elements 316 and 318. P-channel MOS transistor 315 is electrically connected between power supply voltage Vcc1 and a node N16 generating reference voltage Vrsb corresponding to the burn-in mode. Resistor elements 316 and 318 are connected in series between node N16 and ground voltage Vss. Operational amplifier 312 amplifies the voltage difference between reference voltage Vrsn from voltage adjustment circuit **100*n* and the voltage of a connection node N26 connecting resistor elements R1 and R2 and inputs the amplified voltage difference into the gate of P-channel MOS transistor 315**.

According to the configuration of voltage adjustment circuit 310 described above, reference voltage Vrsb corresponding to the burn-in mode is expressed by the following equation (1):

$$Vrsb=(R1+R2)/R2\times Vrsn \quad (1).$$

Namely, the predetermined rate K is expressed as K=(R1+R2)/R2. If resistor element R2 is formed out of, for example, a variable resistor, this predetermined rate K can be adjusted.

By adopting the above-mentioned configuration, tunnel current during the burn-in test establishes a constant relationship with tunnel current in the normal operation mode. It is, therefore, possible to set the current stresses applied to the tunneling film to have a desired, predetermined rate between the normal operation mode (data read) and the burn-in mode.

(Fourth Modification of Second Embodiment)

In memory array configuration in which a dummy memory cell is arranged on memory array 10 for comparison with a selected memory cell, one dummy memory cell is arranged for a plurality of MTJ memory cells. According to the memory array configurations shown in FIGS. 2 and 13, for example, two dummy memory cells are arranged for each memory cell column and one dummy memory cell is, therefore, arranged for each of the (n/2) MTJ memory cell columns.

Due to this, compared with the access frequency of a normal MTJ memory cell, that of the dummy memory cell is high. In the burn-in test, therefore, it is possible to execute stricter screening to the dummy memory cells. In other words, in the burn-in test, it is necessary to apply a higher current stress to each dummy memory cell than that applied to each MTJ memory cell to thereby appropriately clarify the potential defect of the dummy memory cell.

In the fourth modification of the second embodiment, therefore, the configuration of the MRAM device which can set a passing current quantity or current passing time for each MTJ memory cell larger or longer that for each dummy memory cell, will be described.

Figure 19:
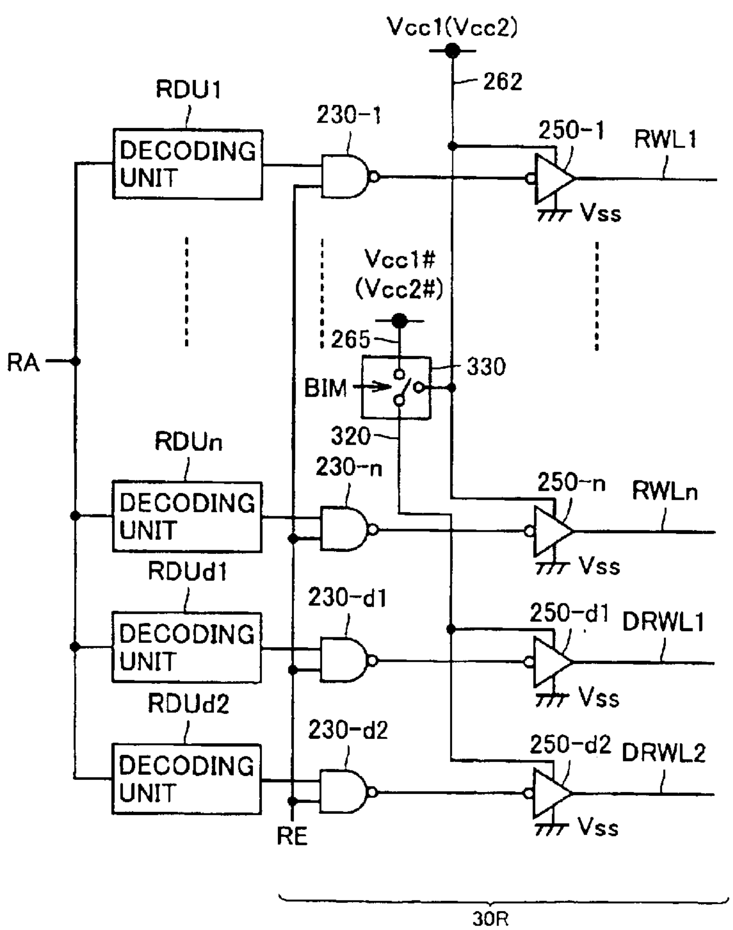
FIG. 19 is a circuit diagram showing a first configuration example of a read word line driving section according to a fourth modification of the second embodiment.

Referring to FIG. 19, read word line drive section 30R in the fourth modification of the second embodiment differs from read word line drive section 30R shown in FIG. 12 in that a power supply node 320 independent of a power supply node 262 and a power supply switch 330 are provided. Since the remaining constituent elements of read word line drive section 30R are the same as those shown in FIG. 12, they will not be repeatedly described herein in detail.

Power supply node 320 is provided independently of power supply node 262 which supplies operating voltage to drive gates 250-1 to **250-*n* corresponding to read word lines RWL1 to RWLn, respectively. Power supply node 320 supplies operating voltage to drive gates 250-*d*1 and 250-*d*2 corresponding to dummy read word lines DRWL1 and DRWL2**, respectively.

Power supply switch circuit 330 selectively connects one of power supply nodes 262 and 265 to power supply node 320 in response to burn-in mode signal BIM. Power supply switch circuit 330 electrically connects power supply node 262 to power supply node 320 in the normal operation. By doing so, in the normal operation mode, since read word lines RWL and dummy read word lines DRWL1 and DRWL2 become equal in voltage level during activation, a selected memory cell and each dummy memory cell become equal in passing current (i.e., sence current Is).

On the other hand, in the burn-in mode, power supply switch 330 electrically connects power supply node 265 to power supply node 320. A higher power supply voltage is inputted into power supply node 265 than that inputted into power supply node 262. If power supply voltage Vcc1 is inputted into power supply node 262, for example, a higher power supply voltage Vcc1# (Vcc1#>Vcc1) is inputted into power supply node 265. If power supply voltage Vcc2 is inputted into power supply node 262, for example, a higher power supply voltage Vcc2# (Vcc2#>Vcc2) is inputted into power supply node 265.

During the burn-in test, the voltages of activated dummy read word lines DRWL1 and DRWL2 are higher than those of activated read word lines RWL. Therefore, the gate voltage of a dummy access transistor ATRd is set higher than that of an access transistor ATR in each MTJ memory cell.

As a result, during the burn-in test, the passing current of each dummy memory cell can be set higher than that of each MTJ memory cell and a higher current stress can be, therefore, applied to the dummy memory cell than that applied to the MTJ memory cell to thereby appropriately clarify the potential defect of the dummy memory cell.

Figure 20:
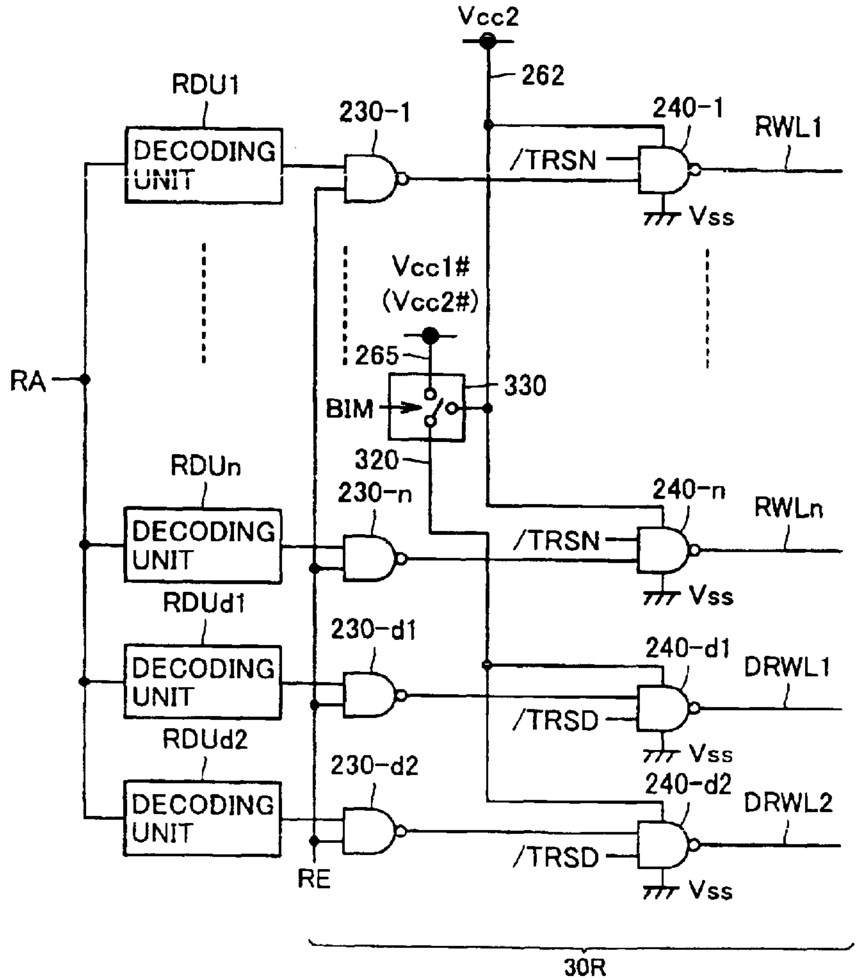
FIG. 20 is a circuit diagram showing a second configuration example of a read word line driving section according to the fourth modification of the second embodiment.

Referring to FIG. 20, read word line drive section 30R in the second configuration example of the fourth modification of the second embodiment differs from read word line drive section 30R shown in FIG. 19 in that drive gates 240-1 to **240-*n* and 240-*d*1 and 240-*d*2 shown in FIG. 11 are provided in place of drive gates 250-1 to 250-*n* and 250-*d*1 and 250-*d*2. Since the remaining constituent elements of read word line drive 30R section are the same as those of read word line drive section 30R shown in FIG. 19**, they will not be repeatedly described herein in detail.

The output of corresponding one of control gates 230-1 to **230-*n* and a normal row test select signal /TRSN are inputted into each of drive gates 240-1 to 240-*n* corresponding to read word lines RWL1** to RWLn, respectively.

The output of corresponding one of control gates **230-*d*1 and 230-*d*2 and a dummy row test select signal /TRSD are inputted into each of drive gates 240-*d*1 and 240-*d*2 corresponding to dummy read word lines DRWL1 and DRWL2**, respectively. Normal row test select signal /TRSN and dummy row test select signal /TRSD are activated to L level at the intervals of predetermined periods in the burn-in mode.

In the burn-in mode, drive gates 240-1 to **240-*n* activate corresponding read word lines RWL to H level, respectively, in response to the activation of normal row test select signal /TRSN. Drive gates 240-*d*1 and 240-*d*2** activates corresponding dummy read word lines DRWL to H level, respectively in response to the activation of dummy row test select signal /TRSD.

In the normal operation mode, normal row test select signal /TRSN and dummy row test select signal /TRSD are set at H level, respectively, and read word lines RWL and dummy read word lines DRWL are, therefore, activated in accordance with a row selection result.

Figure 21:
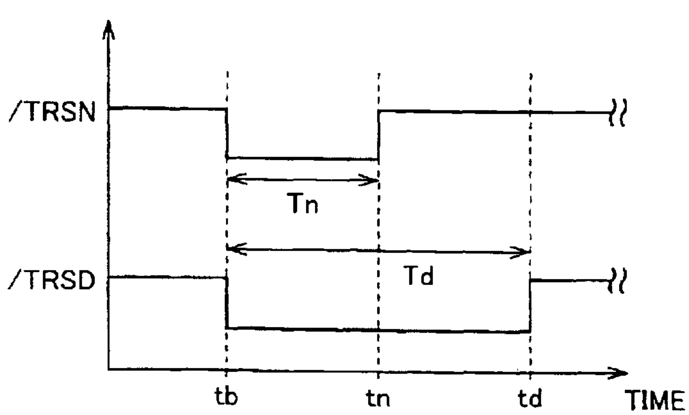
FIG. 21 is a waveform view snowing an active period of a normal row test select signal and that of a dummy row test select signal shown in FIG. 20.

FIG. 21 is a waveform view showing the activation period of normal row test select signal /TRSN and that of dummy row test select signal /TRSD.

Referring to FIG. 21, the activation period of activating dummy row test select signal /TRSD is set longer than that of activating normal row test select signal /TRSN. If normal row test select signal /TRSN and dummy row test select signal /TRSD are activated to L level at time tb, for example, normal row test select signal /TRSN is inactivated (to H level) again at time tb after the passage of time Tn from time Th. On the other hand, dummy row test select signal /TRSD is inactivated (to H level) again at time td after passage of time td, which is longer than time tn, from time Tb.

Consequently, during the burn-in test, time during which dummy access transistor ATRd in each dummy memory cell DMC is turned on, is set longer than time during which access transistor ATR in each MTJ memory cell is turned on, and current passing time for the dummy memory cell is, therefore, set longer than that for the MTJ memory cell. As a result, in the burn-in mode, a higher current stress can be applied to each dummy memory cell, which is higher in access frequency than each MTJ memory cell in the normal operation mode, than that applied to the MTJ memory cell, and a potential defect acceleration test can be thereby conducted.

It is also possible to set both the passing current quantity and current passing time for each dummy memory cell in the burn-in mode to be different from those for each MTJ memory cell by combining the configurations of read word line drive sections shown in FIGS. 19 and 20. Normally, a current stress is expressed as the product of passing current quantity and time for which the current passes (hereinafter, also referred to as "stress product"). If one dummy memory cell is arranged for M (M: an integer not lower than 2) MTJ memory cells, the stress product for the dummy memory cell during the burn-in test may be adjusted to be M times as high as that of the MTJ memory cell. By so adjusting, it is possible to apply a current stress according to the difference in access frequency between the dummy memory cell and the ordinary MTJ memory cell during the burn-in test.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:

a plurality of memory cells each executing data storage; and a plurality of data lines arranged according to predetermined segments of said plurality of memory cells, respectively, wherein each of said plurality of memory cells includes:

a magnetic storage portion magnetized in a direction according to a level of stored data, and having a different electric resistance according to a magnetization direction, and an access element electrically connected to said magnetic storage portion in series between corresponding one of said plurality of data lines and a first voltage, and turned on in at least one selected memory cell as a data read target memory cell, said thin film magnetic memory device further comprises:

a select gate electrically connecting the data line corresponding to said selected memory cell among said plurality of data lines to an internal node; and a data read circuit for reading said stored data of said selected memory cell, and wherein said data read circuit includes a constant current circuit electrically connected between a second voltage and said internal node, and supplying a constant current according to a control voltage adjustable in a nonvolatile manner according to an external input, to said internal node, and a voltage amplification circuit generating read data according to a voltages of said internal node.

2. The thin film magnetic memory device according to claim 1, wherein said constant current circuit includes:

a current source circuit outputting said constant current according to said control voltage;

a first voltage terminal receiving an input of an external adjustment voltage during an operation test;

a voltage switch portion transmitting said adjustment voltage to said current source circuit as said control voltage during said operation test; and a current monitor portion detecting said constant current during said operation test, and wherein said current monitor portion includes a monitor resistor portion electrically connected between said internal node and said first voltage during said operation test, and a second voltage terminal allowing, from outside, application of a predetermined voltage and measurement of resulting current flow during said operation test.

3. The thin film magnetic memory device according to claim 2, wherein said monitor resistor portion includes a plurality of magneto-resistance elements connected in series between said internal node and said first voltage, and each manufactured in a same manner as said magnetic storage portion.

4. The thin film magnetic memory device according to claim 1, wherein said constant current circuit includes a voltage adjustment circuit generating said control voltage, and said voltage adjustment circuit includes a plurality of program elements each changing from a first state to a second state in a nonvolatile manner according to said external input, and a voltage adjustment portion setting a voltage level of said control voltage according to a combination of the respective states of said plurality of program elements.

5. The thin film magnetic memory device according to claim 4, wherein said voltage adjustment circuit includes, a plurality of test gate circuits each provided to correspond to at least one of said plurality of program elements, and a plurality of test terminals provided to correspond to said plurality of test gate circuits, and receiving external pseudo-program signals, respectively, and wherein each of said plurality of test gate circuits is electrically connected to corresponding one of said plurality of program elements in series or in parallel, and forms a same electrical connection state as said second state of the corresponding program element, in response to a corresponding one of said pseudo-program signals.

6. A thin film magnetic memory device comprising:

a plurality of memory cells each executing data storage; and a plurality of data lines arranged according to predetermined segments of said plurality of memory cells, respectively, wherein each of said plurality of memory cells includes a magnetic storage portion magnetized in a direction according to a level of stored data, and having a different electric resistance according to a magnetization direction, said thin film magnetic memory device further comprises a data read circuit for reading said stored data of a selected memory cell, and wherein said data read circuit includes a read current circuit for supplying a read current which is adjustable according to an external input and an amplification circuit generating read data according to the stored memory cell data by using said read current.

7. The thin film magnetic memory device according to claim 6, wherein said read current is adjustable in a non-volatile manner.

8. The thin film magnetic memory device according to claim 6, wherein said read current circuit includes:

a current source circuit outputting said read current according to a control voltage;

a first voltage terminal receiving an input of an external adjustment voltage during an operation test;

a voltage switch portion transmitting said adjustment voltage to said current source circuit as said control voltage during said operation test; and a current monitor portion detecting said read current during said operation test, and wherein said current monitor portion includes a monitor resistor portion electrically connected between a first voltage and an internal node which is connected to said first voltage via a selected memory cell of said memory cells during said operation test, and a second voltage terminal allowing, from outside, application of a predetermined voltage and measurement of resulting current flow during said operation test.

9. The thin film magnetic memory device according to claim 8, wherein said monitor resistor portion includes a plurality of magneto-resistance elements connected in series between said internal node and said first voltage, and each manufactured in a same manner as said magnetic storage portion.

10. The thin film magnetic memory device according to claim 6, wherein said read current circuit includes a voltage adjustment circuit generating a control voltage for controlling said read current, and said voltage adjustment circuit includes a plurality of program elements each changing from a first state to a second in a nonvolatile manner according to said external input, and a voltage adjustment portion setting a voltage level of said control voltage according to a combination of the respective states of said plurality of program elements.

11. The thin film magnetic memory device according to claim 10, wherein said voltage adjustment circuit includes a plurality of test gate circuits each provided to correspond to at least one of said plurality of program elements, and a plurality of test terminals provided to correspond to said plurality of test gate circuits, and receiving external pseudo-program signals, respectively, and wherein each of said plurality of test gate circuits is electrically connected to corresponding one of said plurality of program elements in series or in parallel, and forms a same electrical connection state as said second state of the corresponding program element, in response to a corresponding one of said pseudo-program signals.

12. A memory device comprising:

a plurality of memory cells each executing data storage; and a plurality of data lines arranged according to predetermined segments of said plurality of memory cells, respectively, each of said plurality of memory cells including a storage portion having one of first and second electric resistances according to a level of stored data said memory device further comprises:

a current supply circuit supplying a current passing through said storage portion, said current supply circuit supplying a first constant current to at least one of said plurality of data lines in a normal operation mode, and supplying a second constant current higher than said first constant current, to at least one of said plurality of data lines in another operation mode.

13. The memory device according to claim 12, wherein said storage portion includes a first magnetic body layer magnetized in a fixed direction;

a second magnetic body layer magnetized in a direction according to the level of said stored data, and an insulating film formed between said first and second magnetic body layers, and wherein said another operation mode corresponds to a defect acceleration test for screening said insulating film.

14. The memory device according to claim 12, wherein a bias voltage applied to both ends of said insulating film in said another operation mode is greater than the bias voltage in said normal operation mode.

15. The memory device according to claim 12, wherein each of said memory cells further includes an access element being constituted of a field effect transistor, and electrically connected to said storage portion in series between corresponding one of said plurality of data lines and a first voltage, and selectivity turned on, in the plurality of memory cells in which said access element is turned on, a voltage applied to a gate of said field effect trasistor in said another operation mode is set so that at ON-resistance of said field effect transistor is lower than the ON-resistance in said normal operation mode.

16. The memory device according to claim 12, wherein said plurality of memory cells are arranged in a matrix;

said plurality of data lines are arranged to correspond to respective memory cell columns;

said memory device further comprises a plurality of select gate circuits provided corresponding to respective memory cell columns, and controlling connection between said current supply circuit and said plurality of data lines; and each of said select gate circuits connects N data lines (N: an integer not less than 2) among said plurality of data lines to said currently supply circuit in said another operation mode, and connects one data line among said plurality of data lines corresponding to a selected memory cell, among the plurality of memory cells, as a data read target memory cell.

17. The memory devices according to claim 12, wherein said plurality of memory cells are arranged in a matrix, each of said memory cells further includes an access element electrically connected to said storage portion in series between corresponding one of said plurality of data lines and a first voltage, and selectively turned on;

said memory device further comprises a row select portion controlling said access element to be turned on and off for each memory cell row; and said row select portion turns on access groups corresponding to M memory cell rows (M: an integer not less than 2) in said another operation mode, and turns on the access element groups corresponding to one memory cell row corresponding to a selected memory cell, among the memory cells, as a data read target memory cell in said normal operation mode.

18. The memory device according to claim 12 wherein said current supply circuit includes a current source circuit for outputting a current according to a control voltage to the at least one of said data lines in each of said normal operation mode and said another operation mode, a first voltage adjustment circuit adjusting a first reference voltage corresponding to said first current;

a second voltage adjustment circuit adjusting a second reference voltage corresponding to said second current; and a voltage switch circuit transmitting one of said first and second reference voltages to said current source circuit as said control voltage in accordance with an operation mode.

19. The memory device according to claim 18, wherein said first voltage adjustment circuit adjusts said first reference voltage in a nonvolatile manner in response to a first external input; and said second voltage adjustment circuit adjusts said second reference voltage in a nonvolatile manner in response to a second external input.

20. The memory device according to claim 18, wherein said first voltage adjustment circuit adjusts said first reference voltage in a nonvolatile manner in response to a first external input; and said second voltage adjustment circuit generates said second reference voltage according to said first reference voltage from said first voltage adjustment circuit so that a ratio of said first reference voltage to said second reference voltage has a predetermined value.

21. The memory device according to claim 12, wherein each of said memory cells further includes an access element electrically connected to said storage portion in series between corresponding one of said plurality of data lines and a first voltage, and selectivity turned on, and said memory device further comprises a dummy memory cell provided for M memory cells (Man integer not less than 2) among said plurality of memory cells, wherein said dummy memory cell includes a dummy storage portion having an intermediate electric resistance between said first and second electric resistances, and a dummy access element electrically connected to said dummy storage portion in series betweem one of said plurality of data lines and said first voltage, and selectivity turned on, and wherein a current stress applied to said dummy storage portion in said another operation mode is higher than a current stress applied to said storage portion in at least one target memory cell among said plurality of memory cells.

22. The memory device according to claim 21, further comprising a driver circuit controlling said access element and said dummy access element to be turned on and off, wherein said driver circuit sets a product of time for which a third current passes through said dummy storage portion and said third current, to be M times as large as a product of time for which said second current passes through said storage portion of said test target memory cell and said second current.

23. The memory device according to claim 21, wherein each of said access element is constituted of a first field effect transistor, and each said dummy access element is constituted of and a second field effect transistor, said memory device further comprises a driver circuit controlling said access element and said dummy access element to be turned on and off, and said driver circuit sets each of gate voltages of said first field effect transistor and said second field effect transistor included in said at least one test target memory cell among said plurality of memory cells so that an ON-resistance of said second field effect transistor is lower than an ON-resistance of said first field effect transistor in said another operation mode.

24. The memory device according to claim 21, further comprising a driver circuit controlling said access element and said dummy access element to be turned on and off, wherein said driver circuit sets an on-period of said dummy access element to be longer than an on-period of said access element in said at least one test target memory cell.

25. The memory device according to claim 12, wherein said storage portion is electrically connected between a first voltage and corresponding one of said data lines, in each of said memory cells, and said current supply circuit includes a read drive portion connecting that at least one data line to a second voltage higher than said first voltage, and a data write circuit operating by being supplied with a third voltage higher than said second voltage, and generating a data write current magnetizing said storage portion of a selected memory cell, among said plurality of memory cells, as a data write target memory cell in accordance with the level of the stored data during data write in said normal operation mode, said memory device further comprises a select gate circuit controlling connection between said current supply circuit and said plurality of data lines;

said select gate circuit connects one of said read drive portion and said data write circuit to the at least one corresponding data line among said plurality of data lines corresponding to said selected memory cell in said normal operation mode, and connects said data write circuit to the at least one data line among said plurality of data lines, corresponding to test target memory cells in said another operation mode, and wherein said data write circuit supplies said second constant current in said another operation mode.

* * * * *